United States Patent
Zeng

(10) Patent No.: US 11,636,704 B2
(45) Date of Patent: Apr. 25, 2023

(54) DISPLAY MODULE AND DISPLAY DEVICE

(71) Applicant: Shanghai Tianma Micro-Electronics Co., Ltd., Shanghai (CN)

(72) Inventor: Yang Zeng, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/404,322

(22) Filed: Aug. 17, 2021

(65) Prior Publication Data

US 2023/0017190 A1    Jan. 19, 2023

(30) Foreign Application Priority Data

Jun. 30, 2021    (CN) .......................... 202110732521.6

(51) Int. Cl.
*H01L 27/32* (2006.01)
*G06V 40/13* (2022.01)
*G09G 3/3225* (2016.01)
*H01L 51/52* (2006.01)
*H01L 27/146* (2006.01)

(52) U.S. Cl.
CPC ....... *G06V 40/1318* (2022.01); *G09G 3/3225* (2013.01); *H01L 27/322* (2013.01); *H01L 27/3234* (2013.01); *H01L 27/3244* (2013.01); *H01L 27/3276* (2013.01); *H01L 51/5284* (2013.01); *H01L 27/14678* (2013.01)

(58) Field of Classification Search
CPC ............ H01L 27/3276; H01L 27/3234; H01L 27/322; H01L 27/3244; H01L 51/5284; H01L 27/14678; G06V 40/1365; G06V 40/1318
See application file for complete search history.

(56) References Cited

U.S. PATENT DOCUMENTS

2020/0203468 A1*  6/2020  Zeng ................... H01L 27/3276
2022/0075985 A1*  3/2022  Zhu .................... G06V 40/1365
2022/0171956 A1*  6/2022  Shi ...................... H01L 27/3234

FOREIGN PATENT DOCUMENTS

CN          209433415 U      9/2019

* cited by examiner

*Primary Examiner* — Abdul-Samad A Adediran
(74) *Attorney, Agent, or Firm* — Anova Law Group PLLC

(57) ABSTRACT

A display module and a display device are provided. The display module includes a fingerprint recognition layer including photosensitive sensors, a display panel including a function layer containing fingerprint recognition light sources and imaging apertures, and a cover plate. A vertical distance between a surface of the cover plate at a side away from the functional layer and a corresponding imaging aperture is a first distance h1; a vertical distance between a photosensitive sensor and a corresponding imaging aperture is a second distance h2; along a direction parallel to a plane where the display panel is located, a distance between any two adjacent fingerprint recognition light sources is P1, and a distance between any two adjacent photosensitive sensors is P3;

$$K = \frac{2P3 \times h1}{P1 \times h2};$$

0.8N<K<1.2N; and N is a positive integer.

20 Claims, 12 Drawing Sheets

DISPLAY MODULE AND DISPLAY DEVICE

CROSS-REFERENCE TO RELATED APPLICATION

This application claims the priority of Chinese Patent Application No. 202110732521.6, filed on Jun. 30, 2021, the content of which is incorporated by reference in its entirety.

TECHNICAL FIELD

The present disclosure generally relates to the field of display technology and, more particularly, relates to a display module and a display device.

BACKGROUND

Fingerprints are innate to everyone. It consists of ridges and valleys on the surface of the fingertips. The combination details of these ridges and valleys determine the uniqueness of the fingerprint pattern. With the development of science and technology, various terminal devices have become necessities in life, and users have higher and higher requirements for terminal devices. For security, a fingerprint recognition has excellent privacy protection functions due to the unique characteristics of fingerprints. Therefore, the fingerprint recognition is widely used in various terminal devices, such as mobile phones, tablets, and smart wearable devices to increase user experience and security. Before operating the display device with the fingerprint recognition function, the user only needs to touch the display device with his/her finger to perform an authorization verification, which simplifies the authorization verification process.

In the existing technologies, an organic light-emitting diode (OLED) display panel with a fingerprint recognition function uses a small hole designed in the image sensors and the OLED display panel to realize the fingerprint recognition through the principle of the pinhole imaging. However, according to the principle of the pinhole imaging, as the object distance decreases, the light source configured for the fingerprint recognition is likely to form discrete images after being imaged through the small hole, resulting in serious unevenness in the amount of light received by the image sensor during the fingerprint recognition. Based on the current requirements for thinner and lighter screens, the object distance is likely to decrease accordingly. The severe unevenness of the amount of light received by the image sensors during the fingerprint recognition has become a major factor affecting the effect of the fingerprint recognition.

Therefore, there is a need to provide a display module and a display device capable of optimizing the sensitivity of the image sensors and improving the fingerprint recognition performance in the fingerprint recognition technology for optimizing the pinhole imaging. The disclosed driving circuits, driving methods, display panels and display devices are directed to solve one or more problems set forth above and other problems in the art.

SUMMARY

One aspect of the present disclosure provides a display module. The display module may include a fingerprint recognition layer; a display panel; and a cover plate. The display panel includes a functional layer disposed between the fingerprint recognition layer and the cover plate; the fingerprint recognition layer includes a plurality of photosensitive sensors; the functional layer includes a plurality of fingerprint recognition light sources and a plurality of imaging apertures; the plurality of imaging apertures are configured to image a fingerprint that is in contact with the cover plate onto the plurality of photosensitive sensors; a vertical distance between a surface of the cover plate at a side away from the functional layer and a corresponding imaging aperture of the plurality of imaging apertures is a first distance h1; a vertical distance between a photosensitive sensor of the plurality of photosensitive sensors and a corresponding imaging aperture of the plurality of imaging apertures is a second distance h2; along a direction parallel to a plane where the display panel is located, a distance between any two adjacent fingerprint recognition light sources is P1, and a distance between any two adjacent photosensitive sensors is P3;

$$K = \frac{2P3 \times h1}{P1 \times h2};$$

0.8N<K<1.2N; and N is a positive integer.

Another aspect of the present disclosure provides display device. The display device may include a display module. The display module may include a fingerprint recognition layer; a display panel; and a cover plate. The display panel includes a functional layer disposed between the fingerprint recognition layer and the cover plate; the fingerprint recognition layer includes a plurality of photosensitive sensors; the functional layer includes a plurality of fingerprint recognition light sources and a plurality of imaging apertures; the plurality of imaging apertures are configured to image a fingerprint that is in contact with the cover plate onto the plurality of photosensitive sensors; a vertical distance between a surface of the cover plate at a side away from the functional layer and a corresponding imaging aperture of the plurality of imaging apertures is a first distance h1; a vertical distance between a photosensitive sensor of the plurality of photosensitive sensors and a corresponding imaging aperture of the plurality of imaging apertures is a second distance h2; along a direction parallel to a plane where the display panel is located, a distance between any two adjacent fingerprint recognition light sources is P1, and a distance between any two adjacent photosensitive sensors is P3;

$$K = \frac{2P3 \times h1}{P1 \times h2};$$

0.8N<K<1.2N; and N is a positive integer.

Other aspects of the present disclosure can be understood by those skilled in the art in light of the description, the claims, and the drawings of the present disclosure.

BRIEF DESCRIPTION OF THE DRAWINGS

The drawings incorporated in the specification and constituting a part of the specification illustrate the embodiments of the present disclosure, and together with the description are configured to explain the principle of the present disclosure.

DETAILED DESCRIPTION

Figure 1:
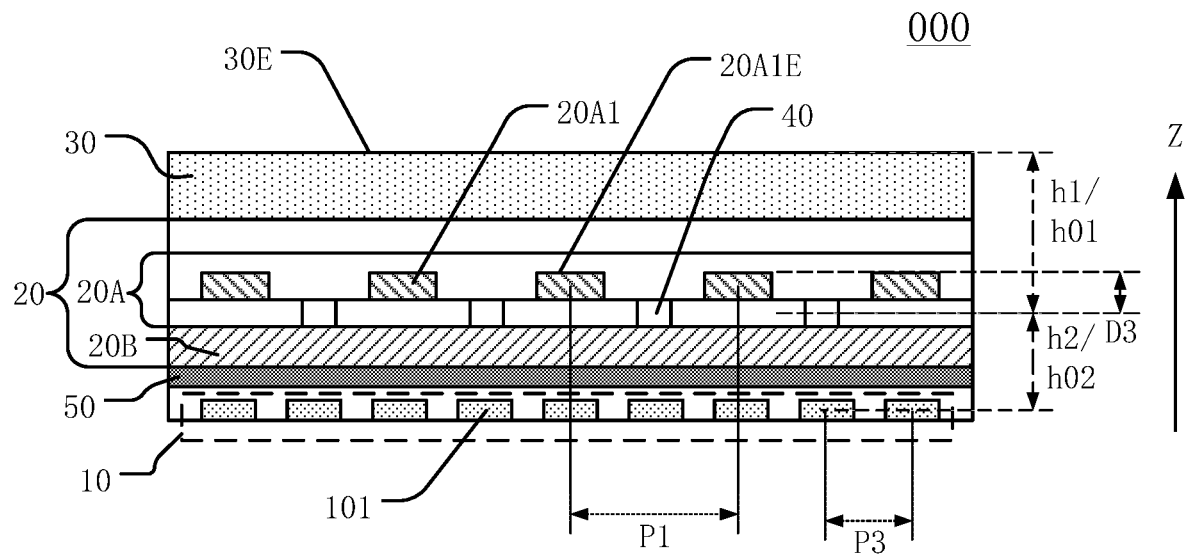
FIG. 1 illustrates a layer arrangement structure of an exemplary display module according to various disclosed embodiments of the present disclosure.

Various exemplary embodiments of the present disclosure will now be described in detail with reference to the accompanying drawings. It should be noted that unless specifically stated otherwise, the relative arrangement of components and steps, numerical expressions and numerical values set forth in these embodiments do not limit the scope of the present disclosure.

The following description of at least one exemplary embodiment is actually only illustrative, and in no way serves as any limitation to the present disclosure and its application or use.

The technologies, methods, and equipment known to those of ordinary skill in the relevant fields may not be discussed in detail, but where appropriate, the technologies, methods, and equipment should be regarded as part of the specification.

In all the examples shown and discussed herein, any specific value should be interpreted as merely exemplary, rather than as a limitation. Therefore, other examples of the exemplary embodiment may have different values.

It should be noted that similar reference numerals and letters indicate similar items in the following drawings, and therefore, once an item is defined in one drawing, it does not need to be further discussed in the subsequent drawings.

Figure 2:
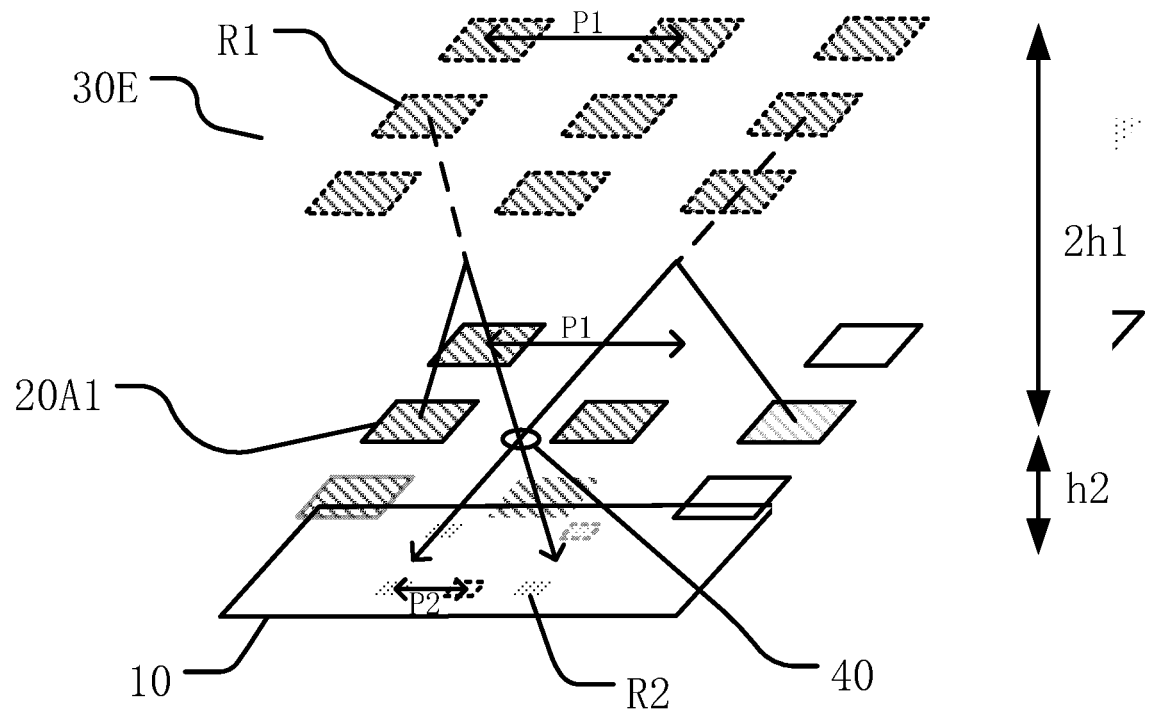
FIG. 2 illustrates the separated mechanism structures of the layer structure in FIG. 1.

The present disclosure provides a display module and a display device. FIG. 1 illustrates a layer arrangement structure of an exemplary display module according to various disclosed embodiment of the present disclosure. FIG. 2 is the separated layer structure in FIG. 1 (FIG. 1 and FIG. 2 are only schematic diagrams illustrating the arrangement relationship of the local positions of the relevant film layers of this embodiment, and do not mean that the actual display module only includes the structures in the figures and, to clearly illustrate the principle of this embodiment, FIG. 2 is filled with transparency).

As shown in FIGS. 1-2, the display module 000 provided in this embodiment may include a fingerprint recognition layer 10, a display panel 20, and a cover plate 30. The display panel 20 may include a functional layer 20A, and the functional layer 20A may be disposed between the fingerprint recognition layer 10 and the cover plate 30.

The fingerprint recognition layer 10 may include a plurality of photosensitive sensors 101.

The functional layer 20A may include a plurality of fingerprint recognition light sources 20A1 and a plurality of imaging apertures 40. The imaging apertures 40 may be configured to image the fingerprint information in contact with the cover plate 30 onto the photosensitive sensors 101.

The vertical distance between the surface 30E on the side of the cover plate 30 away from the functional layer 20A and an imaging aperture 40 of the plurality of imaging apertures 40 may be referred to as a first distance h1. The vertical distance between the photosensitive sensor 101 and the imaging aperture 40 may be referred as a second distance h2.

Along a direction parallel to the plane where the display panel 20 is located, the distance between any two adjacent fingerprint recognition light sources 20A1 may be P1, and the distance between any two adjacent photosensitive sensors 101 may be P3.

$$K = \frac{2P3 \times h1}{P1 \times h2},$$

and 0.8N<K<1.2N. N may be a positive integer.

While the display module 000 provided in this embodiment may realize the display function, it may also include a fingerprint recognition structure for realizing the fingerprint recognition function. The display module 000 may include at least the fingerprint recognition layer 10, the display panel 20 and the cover plate 30. In one embodiment, the display panel 20 may be an organic light-emitting diode display panel or a flexible display panel. The display panel 20 may include at least the functional layer 20A, and the functional layer 20A may be any functional layer of the display panel 20 that has a display function or a driving function or other functions that can achieve a display effect (FIG. 1 and FIG. 2 use the functional layer with display function as an example for illustration), it may only need to satisfy that the functional layer 20A may be located between the fingerprint recognition layer 10 and the cover plate 30. For example, the fingerprint recognition layer 10 including multiple photosensitive sensors 101 may be located on the side of the functional layer 20A away from the cover plate 30.

The functional layer 20A may include the plurality of fingerprint recognition light sources 20A1 and the plurality of imaging apertures 40. The imaging apertures 40 may be opened in a certain film layer or multiple film layers of the functional layer 20A. This embodiment is not specifically limited, and may only satisfy that, after the light emitted by the fingerprint recognition light sources 20A1 reach the surface 30E on the side of the cover plate 30 away from the functional layer 20A, and then is reflected by the touch body (such as a finger) contacting the cover plate 30 through the imaging apertures 40, and finally, the fingerprint of the touch subject may be imaged onto the photosensitive sensors 101 of the fingerprint recognition layer 10 through the imaging apertures 40. The ridges and valleys of the fingerprint may be detected by the photosensitive sensors 101, and then an image for the fingerprint recognition may be formed to complete the fingerprint recognition function. The imaging apertures 40 may be configured to image the fingerprint information in contact with the cover plate 30 onto the photosensitive sensors 101, and the photosensitive sensors 101 may be configured to detect the fingerprint image.

In one embodiment, the vertical distance between the surface 30E on the side of the cover plate 30 away from the functional layer 20A and the imaging aperture 40 may be set as the first distance h1 (the vertical distance in this embodiment may be referred to the distance along the direction perpendicular to the plane where the display panel 20 is located), and the vertical distance between the photosensitive sensor 101 and the imaging aperture 40 may be the second distance h2. According to the principle of the pinhole imaging, when a finger is placed on the fingerprint area on the display module 000, the light emitted by the fingerprint recognition light sources 20A1 of the functional layer 20A of the display panel 20 may be irradiated to the fingerprint of the finger through the film layer of the display panel 20, and be projected back on the photosensitive sensors 101 of the fingerprint recognition layer 10. The fingerprint features may be processed by the collimated optical path modulation of the pinhole imaging and image stitching software, and finally a digital fingerprint image that can be processed by the fingerprint device algorithm may be formed.

Further, as shown in FIG. 2 (to clearly show that the second imaging R2 may be finally imaged on the photosensitive sensors 101 of the fingerprint recognition layer 10, only one imaging aperture 40 is shown in FIG. 2 and the photosensitive sensor 101 of the fingerprint recognition layer 10 is not shown. The structure of the photosensitive sensor 101 on the fingerprint recognition layer 10 may be understood with reference to the structure in FIG. 1), because the fingerprint recognition light sources 20A1 of this embodiment may first need to form a reflection image R1 on the side of the cover plate 30 away from the functional layer 20A, and then the first reflection image R1 may pass through the imaging apertures 40 to form the final second imaging R2 on the fingerprint recognition layer 10. Therefore, the object distance of the pinhole imaging in this embodiment should be understood as the vertical distance between the imaging aperture 40 and the first reflection image R1 formed by the fingerprint recognition light sources 20A1 on the side of the cover plate 30 away from the functional layer 20A, for example, twice the first distance h1. Further, the final second image R2 may be formed on the photosensitive sensors 101. Thus, the image distance of the pinhole imaging may be the vertical distance between the photosensitive sensor 101 and the imaging aperture 40, for example, the second distance h2. Along the direction parallel to the plane where the display panel 20 is located, the distance between any two adjacent fingerprint recognition light sources 20A1 may be P1 (the distance between any two adjacent fingerprint recognition light sources 20A1 in this embodiment may be understood as the distance between the geometric center points of any two adjacent fingerprint recognition light sources 20A1 along the direction parallel to the plane where the display panel 20 is located), the distance between any two adjacent first reflection images R1 formed by the fingerprint recognition light sources 20A1 on the side of the cover plate 30 away from the functional layer 20A may also be P1. The distance between any two adjacent second imaging R2 (the final image formed on the photosensitive sensors 101 by the first reflection image R1 formed by the fingerprint recognition light source 20A1 on the side of the cover plate 30 away from the functional layer 20A through the imaging aperture 40) may be P2 (the distance between any two adjacent second imaging R2 in this embodiment may be understood as the distance between the geometric center points of any two adjacent second imaging R2 along a direction parallel to the plane where the display panel 20 is located). The distance between any two adjacent photosensitive sensors 101 may be P3 (the distance between any two adjacent photosensitive sensors 101 in this embodiment can be understood as the distance between the geometric center points of any two adjacent photosensitive sensors 101 along a direction parallel to the plane where the display panel 20 is located). According to the principle of the pinhole imaging, $$\frac{\text{Objective distance}}{\text{Image distance}} = \frac{P1}{P2} = \frac{2h1}{h2}.$$

Because $$\frac{P1}{P2} = \frac{2h1}{h2}, \text{ then } P2 = \frac{h2}{2h1} \times P1 = s \times P1, \text{ and } s = \frac{h2}{2h1}$$

Due to the current requirements for the lightness and thinness of the screen, the thickness of the cover plate 30 may be as thin as possible under the premise of ensuring the protection function. Thus, the object distance of the pinhole imaging in this embodiment may be bound to become smaller, and the object distance may even be reduced to be smaller than the image distance. However, according to the principle of the pinhole imaging, as the object distance decreases, the final image formed on the photosensitive sensors 101 (the second image R2) formed by the first reflection image R1 formed by the fingerprint recognition light sources 20A1 on the side of the cover plate 30 away from the functional layer 20A, and then passing through the imaging aperture 40 may be likely to form a discrete image, which may cause serious unevenness in the amount of light received by the photosensitive sensors 101 during fingerprint recognition, and the fingerprint recognition function may be affected. To solve this problem, the present embodiment associates the relationship between the distance P3 between any two adjacent photosensitive sensors 101 and the distance P1 between any two adjacent fingerprint recognition light sources 20A1 with the K value. Because $$\frac{P1}{P2} = \frac{2h1}{h2}, \text{ then } P2 = \frac{h2}{2h1}, \text{ and } s = \frac{h2}{2h1},$$
$$\text{then } K = \frac{P3}{P2} = \frac{P3}{s \times P1} = \frac{2P3 \times h1}{P1 \times h2}.$$

Thus, the ratio K of the distance P3 between any two adjacent photosensitive sensors 101 in the fingerprint recognition layer 10 and s times of the distance P1 between any two adjacent fingerprint recognition light sources 20A1 may be limited to a certain value. Accordingly, the problem of serious unevenness in the amount of light received when the photosensitive sensors 101 performs the fingerprint recognition, which may affect the fingerprint recognition function, may be solved.

Therefore, in this embodiment, to solve the above problem, the ratio of the distance P3 between any two adjacent photosensitive sensors 101 in the fingerprint recognition layer 10 and the s times of the distance $$P1\left(s = \frac{h2}{2h1}\right)$$

between any two adjacent fingerprint recognition light sources 20A1 may be set as K, and 0.8N<K<1.2N. N is a positive integer. When N=1, 0.8<K<1.2, that is, $$0.8 < \frac{P3}{s \times P1} < 1.2.$$

When N=2, 1.6<K<2.4, that is $$1.6 < \frac{P3}{s \times P1} < 2.4.$$

When N=3, 2.4<K<3.6, that is $$2.4 < \frac{P3}{s \times P1} < 3.6.$$

When N=4, 3.2<K<4.8, that is, $$3.2 < \frac{P3}{s \times P1} < 4.8 \ldots,$$

and so on. When N=3, N=4 When the value range of K overlaps, the union of the two may be used. For example, when N=3, 2.4<K<3.6, when N=4, 3.2<K<4.8, then 2.4<K<4.8. When the value of $$K = \frac{P3}{s \times P1}$$

is within the above range, the amount of light received by the photosensitive sensors 101 may satisfy a relatively uniform effect.

Because $$\frac{P1}{P2} = \frac{2h1}{h2}, \text{ then } P2 = \frac{h2}{2h1} \times P1, K = \frac{P3}{s \times P1} = \frac{2P3 \times h1}{P2 \times h2},$$

and 0.8N<K<1.2N. N may be a positive integer. When the display module 000 is produced, along a direction parallel to the plane where the display panel 20 is located, the distance P1 between any two adjacent fingerprint recognition light sources 20A1 of the functional layer 20A of the display panel 20 may be determined, and the distance P3 between any two adjacent photosensitive sensors 10 of the fingerprint recognition layer 10 may be determined. At this time, to improve the photosensitivity uniformity of the photosensitive sensors 101 and improve the fingerprint recognition performance of the display module 000, the values of h1 and h2 may be adjusted to achieve that the ratio K of the distance P3 between any two adjacent photosensitive sensors 101 and s times of the distance $$P1\left(s = \frac{h2}{2h1}\right)$$

between any two adjacent fingerprint recognition light sources 20A1 may satisfy 0.8N<K<1.2N. N is the value range of a positive integer.

Therefore, in one embodiment, along a direction parallel to the plane where the display panel 20 is located, the distance between any two adjacent fingerprint recognition light sources 20A1 may be set as P1, and the distance between any two adjacent photosensitive sensors 101 may be set as P3, $$K = \frac{2P3 \times h1}{P1 \times h2},$$

and 0.8N<K<1.2N. N may be a positive integer. Such a configuration may allow the ratio K of the distance P3 between any two adjacent photosensitive sensors 101 in the fingerprint recognition layer 10 and the s times of the distance $$P1\left(s = \frac{h2}{2h1}\right)$$

between any two adjacent fingerprint recognition light sources 20A1 to have the above corresponding relationship, the obvious unevenness of the photosensitive sensors 101 may be avoided, the uniformity of photosensitivity of the photosensitive sensors 101 may be improved, and the fingerprint recognition performance of the display module 000 may be improved.

In one embodiment, the ratio K of the distance P3 between any two adjacent photosensitive sensors 101 in the fingerprint recognition layer 10 and the s times of the distance $$P1\left(s = \frac{h2}{2h1}\right)$$

between any two adjacent fingerprint recognition light sources 20A1 may be set in the range of 0.8N<K<1.2N (N is a positive integer). Even if such a configuration is configured in a thin display module with a small object distance, the uniformity of the photosensitive sensors 101 may be improved, and the fingerprint recognition performance of the display module 000 may be improved. Further, in this embodiment, the structure of the fingerprint recognition may be realized by the pinhole imaging principle of the imaging apertures 40. When the K value is adjusted, it may be only necessary to adjust the first distance between the surface 30E on the side of the cover plate 30 away from the functional layer 20A in the structure of the display module 000 itself and the imaging apertures 40, or the second distance h2 between the photosensitive sensor 101 in the structure of the display module 000 itself and the imaging aperture 40, to allow the ratio K of the distance P3 between two adjacent photosensitive sensors 101 of the fingerprint recognition layer 10 and the s times of the distance $$P1\left(s = \frac{h2}{2h1}\right)$$

between any two adjacent fingerprint recognition light sources 20A1 to satisfy 0.8N<K<1.2N. The operation and calculations may be both relatively convenient. Compared with the technical solution in the related art that the display module uses the lens to realize the fingerprint recognition effect, because the fingerprint recognition solution of the lens structure is not only affected by the nature of the lens itself when performing a fingerprint recognition (for example, the thickness of the lens and the curvature of the lens surface will affect the transmission path of the fingerprint recognition light), the focal length of the lens will also affect the convergence effect and convergence position of the fingerprint recognition light. Such parameters themselves may all be important factors affecting the fingerprint recognition effect. Thus, there are many and complicated factors in the fingerprint recognition scheme with lens structures in the existing technology that affect the effect of fingerprint recognition. However, the fingerprint recognition scheme implemented by the principle of the pinhole imaging in this embodiment may improve the uniformity of the light sensitivity of the photosensitive sensors by simply adjusting the values of h1 and h2 of the display module 000 itself, and the fingerprint recognition performance of the display module may be improved without being affected by the nature of the imaging aperture 40 itself.

In one embodiment, the display panel 20 provided in this embodiment may further include a base substrate 20B. The base substrate 20B may be located between the fingerprint recognition layer 10 and the functional layer 20A. For example, the photosensitive sensors 101 of the fingerprint recognition layer 10 of this embodiment may be an external structure arranged under the base substrate 20B of the display panel 20 (as shown in FIG. 1). In another embodiment, the base substrate 20B may also be disposed on the side of the fingerprint recognition layer 10 away from the functional layer 20A. For example, the photosensitive sensors 101 of the fingerprint recognition layer 10 of this embodiment 10 may be a structure integrated in the display panel 20 (not shown in the drawings) that is disposed above the base substrate 20B of the display panel 20. This embodiment is not specifically limited. During specific implementation, an external fingerprint recognition structure or an integrated fingerprint recognition structure may be installed according to actual needs.

The first distance h1 in this embodiment may be the vertical distance between the surface 30E on the side of the cover plate 30 away from the functional layer 20A and the imaging aperture 40, and the second distance h2 may be the vertical distance between the photosensitive sensor 101 and the imaging aperture 40. When the photosensitive sensor 101 of the fingerprint recognition layer 10 of this embodiment is an external structure arranged under the base substrate 20B of the display panel 20, the fingerprint recognition layer 10 may be attached and fixed to the base substrate 20B by a first adhesive layer 50. At this time, the second distance h2 may be adjusted by changing the thickness of the first adhesive layer 50 such that the ratio K of the distance P3 between two adjacent photosensitive sensors 101 of the fingerprint recognition layer 10 and the s times of the distance $$P1\left(s = \frac{h2}{2h1}\right)$$

between any two adjacent fingerprint recognition light sources 20A1 to satisfy 0.8N<K<1.2N may meet the range set in this embodiment, the influence when adjusting the thickness of other layers in the display module 000 to the display performance may be avoided. The first adhesive layer 50 may only has the effect of attaching and fixing, and the variation of its thickness may have a negligible effect on the display performance.

It should be noted that this embodiment does not specifically limit the structure of the display panel. The display panel of this embodiment may be an organic light-emitting diode display panel or a flexible display panel. The structure includes but is not limited to the above-mentioned structure, and may also include other implementations. The film structure of the display function, etc. may be specifically understood with reference to the structure of an organic light-emitting diode display panel or a flexible display panel in the related art, which is not described in detail in this embodiment.

In some embodiments, referring to FIGS. 1-2 in combination, the ratio of the distance P3 between any two adjacent photosensitive sensors 101 in the fingerprint recognition layer 10 and the s times of the distance $$P1\left(s = \frac{h2}{2h1}\right)$$

between any two adjacent fingerprint recognition light sources 20A1 may be set as K, and 0.9N<K<1.1N. N is a positive integer. When N=1, 0.9<K<1.9, that is, $$0.9 < \frac{P3}{s \times P1} < 1.1.$$

When N=2, 1.8<K<2.2, that is, $$1.8 < \frac{P3}{s \times P1} < 2.2.$$

When N=3, 2.7<K<3.3, that is, $$2.7 < \frac{P3}{s \times P1} < 3.3.$$

When N=4, 3.6<K<4.4, that is, $$3.6 < \frac{P3}{s \times P1} < 4.4 \ldots,$$

and so on, the amount of light received by the photosensitive sensors 101 may satisfy a relatively uniform effect.

Further, in one embodiment, along a direction parallel to the plane where the display panel 20 is located, the distance between any two adjacent fingerprint recognition light sources 20A1 may be set as P1, and the distance between any two adjacent photosensitive sensors 101 may be set as P3, $$K = \frac{2P3 \times h1}{P1 \times h2},$$

and 0.9N<K<1.1N. N is a positive integer. Such a configuration may allow the ratio K of the distance P3 between any two adjacent photosensitive sensors 101 in the fingerprint recognition layer 10 and the s times of the distance $$P1\left(s = \frac{h2}{2h1}\right)$$

between any two adjacent fingerprint recognition light sources 20A1 to have the above corresponding relationship, the obvious unevenness of the photosensitive sensors 101 may be better avoided, the uniformity of photosensitivity of the photosensitive sensors 101 may be further improved, and the fingerprint recognition performance of the display module 000 may be better improved.

In one embodiment, K in this embodiment is an integer. For example, the ratio K of the distance P3 between any two adjacent photosensitive sensors 101 in the fingerprint recognition layer 10 and the s times of the distance $$P1\left(s = \frac{h2}{2h1}\right)$$

between any two adjacent fingerprint recognition light sources 20A1 may satisfy 0.8N<K<1.2N. N may be a positive integer, and K also needs to be an integer, such that the ratio of $$\frac{P3}{s \times P1}$$

may be an integer. When performing a simulation experiment on the light-receiving distribution on the surface of the photosensitive sensors 101 of the fingerprint recognition layer 10 on the display module 000 of this embodiment, under the premise that other conditions are the same, comparing the condition taking any value in the range of 0.8N<K<1.2N (for example, K=0.91) and the condition taking K as an integer (for example, taking K=1), from the obtained simulation map of the light distribution on the surface of the photosensitive sensor 101, when K=0.91, although the surface of the photosensitive sensor 101 in the local position may receive uniform light, the light receiving uniformity of the overall photosensitive sensors 101 of the display module 000 may still be relatively poor; and when K=1, the light receiving uniformity of the overall photosensitive sensors 101 of the display module 000 may be relatively good. Thus, when K is taken an integer within the range of 0.8N<K<1.2N, the overall photosensitive uniformity of the photosensitive sensor 101 may be improved.

Optionally, N≤2 in this embodiment, that is, the ratio K of the distance P3 between any two adjacent photosensitive sensors 101 in the fingerprint recognition layer 10 and s times of the distance $$P1\left(s = \frac{h2}{2h1}\right)$$

between any two adjacent fingerprint recognition light sources 20A1 may satisfy 0.8N<K<1.2N. N may be a positive integer. and N≤2. Accordingly, the ratio K of $$\frac{P3}{s \times P1}$$

may satisfy 0.8<K<1.2, or 1.6<K<2.4. When performing a simulation experiment on the light-receiving distribution of the photosensitive sensor 101 of the fingerprint recognition layer 10 on the display module 000 of this embodiment, under the premise that other conditions are the same, N≤2 (for example, N=1). Comparing with the case taking any value of K in the range of N>2 (for example, N=4), from the obtained light distribution simulation diagram of the surface of the photosensitive sensors 101, N=4, and 3.2<K<4.8. although the light-receiving uniformity of the surface of the photosensitive sensors 101 in the local positions may be acceptable, the light-receiving uniformity of the overall photosensitive sensors 101 of the display module 000 may be not as desire. When N=1, 0.8<K<1.2, the light-receiving uniformity of the overall photosensitive sensor 101 of the display module 000 may be as desired. Therefore, taking K within the range of 0.8<K<1.2 or 1.6<K<2.4 may be beneficial to further improve the overall photosensitive uniformity of the photosensitive sensor 101.

In another embodiment, K may be an integer, and N≤2. For example, the ratio K of the distance P3 between any two adjacent photosensitive sensors 101 in the fingerprint recognition layer 10 and the s times of the distance $$P1\left(s = \frac{h2}{2h1}\right)$$

between any two adjacent fingerprint recognition light sources may be 1 or 2, that is, when P3=s×P1 or P3=2s×P1, the light-receiving uniformity of the overall photosensitive sensors 101 of the display module 000 may be at an optimized condition; and the fingerprint recognition effect may be improved.

Figure 3:
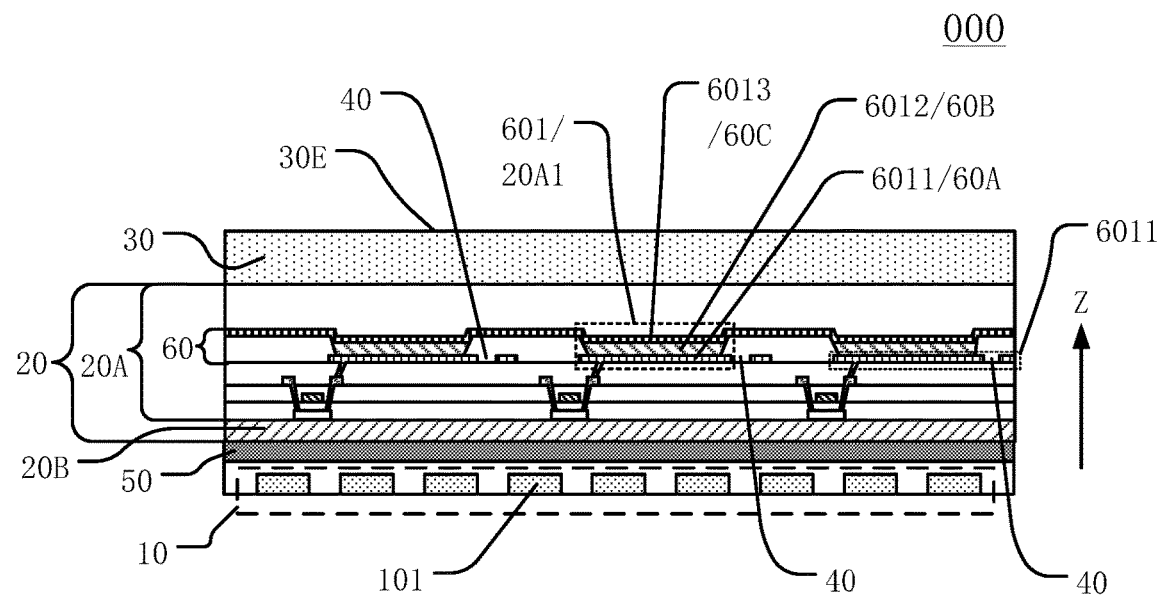
FIG. 3 illustrates another exemplary layer arrangement structure of a display module according to various disclosed embodiments of the present disclosure.

FIG. 3 is a schematic diagram of another exemplary layer distribution structure of a display module according to various disclosed embodiments (FIG. 3 is only a schematic diagram illustrating the distribution relationship of the local positions of the relevant film layers of this embodiment and does not mean that the actual display module only includes the structure in the figure). In some embodiments, referring to FIGS. 1-2 and FIG. 3 in combination, the functional layer 20A of the display panel 20 may include a display function layer 60. The display function layer 60 may include a plurality of light-emitting elements 601. Along a direction Z perpendicular to the plane where the display panel 20 is located, the display function layer 60 may include an anode layer 60A, a light-emitting layer 60B, and a cathode layer 60C that are stacked. The light-emitting element 601 may include an anode 6011 located in the anode layer 60A, an organic light-emitting portion 6012 located in the light-emitting layer 60B, and a cathode 6013 located in the cathode layer 60C.

The imaging aperture 40 and the anode layer 60A may be disposed in the same layer.

Such a configuration may explain that the functional layer 20A having the imaging aperture 40 and the fingerprint recognition light source 20A1 may include the display function layer 60 of the display panel 20, and the display function layer 60 of the display panel 20 may include a plurality of light-emitting elements 601 of the display panel 20 for realizing the display effect. The plurality of light-emitting elements 601 may be arranged in an array on the base substrate 20B of the display panel 20, or may be arranged in a non-array arrangement, which is not specifically limited in this embodiment. Along the direction Z perpendicular to the plane where the display panel 20 is located, the film structure of the display functional layer 60 may include an anode layer 60A, a light-emitting layer 60B, and a cathode layer 60C that are stacked, and each light-emitting element 601 may also include the anode 6011, the organic light-emitting portion 6012, and the cathode 6013 that may be stacked along the direction Z of the plane where the display panel 20 is located. The anode 6011 may be provided in the anode layer 60A, the organic light-emitting portion 6012 may be provided in the light-emitting layer 60B, and the cathode 6013 may be provided in the cathode layer 60C. The organic light-emitting portion 6012 may also include other functional layers, such as a hole transport function layer, and/or an electron transport function layer, etc. The hole transport function layer and the electron transport function layer may be one layer or more than one layer. For example, the hole transport function layer may include the hole injection layer and the hole transport layer, and the electron transport function layer may include an electron transport layer and an electron injection layer. The display panel 20 of this embodiment may be an organic light-emitting diode display panel. The light-emitting principle may be that the organic light-emitting portion 6012 is driven by the electric field formed by the anode 6011 and the cathode 6013 to cause a light-emission through a carrier injection and recombination. The specific structure and light-emitting principle of the panel 20 will not be described in detail. In specific implementation, the structure and light-emitting principle of organic light-emitting diodes in the related art can be used for understanding. The imaging aperture 40 of this embodiment may be provided in the same layer as the anode layer 60A such that the imaging aperture 40 may be provided in the film layer of the display function layer 60 of the display panel 20.

In one embodiment, as shown in FIG. 3, the light-emitting element 601 of the display function layer 60 in this embodiment may be at least partially multiplexed as a fingerprint recognition light source 20A1 such that the structure of the light-emitting element 601 included in the display panel 20 may be multiplexed as the fingerprint recognition light source 20A1 to achieve the fingerprint recognition function. Accordingly, the increase the overall thickness of the display panel 20 caused by the addition of the fingerprint recognition light source 20A1 may be avoided. Thus, the film thickness of the display module 000 may be reduced, and a thinner module structure may be realized.

In another embodiments, referring to FIG. 3, the anode 6011 of the light-emitting element 601 may be provided with an imaging aperture 40. Optionally, the imaging aperture 40 and the orthographic projection of the light-emitting element 601 of the organic light-emitting portion 6012 on the anode 6011 may not overlap. The anode 6011 of each light-emitting element 601 may be extended to a certain portion to open the imaging aperture 40, and this portion of the anode 6011 may not overlap the organic light-emitting portion 6012. Thus, the effect to the disposition of the imaging aperture 40 on the light-emitting effect of the light-emitting element 601 may be prevented. It should be noted that since the aperture of the imaging aperture 40 may be generally small, directly opening the imaging aperture 40 with a small aperture on the anode 6011 of the light-emitting element 601 may almost have no effect on the performance of the anode 6011, and the display quality of the display panel 20 may be still ensured.

When the imaging aperture 40 and the anode layer 60A in this embodiment are arranged in the same layer, if the anode 6011 in the display panel 20 includes a light-shielding layer (such as a black matrix, or other light-shielding material) on the side of the anode 6011 away from the base substrate 20B, a through-hole may need to be opened in the light-shielding layer. The through-hole may be set as a through-hole with an aperture larger than the imaging aperture 40 to prevent the light-shielding layer from affecting the light imaging of the aperture and thereby affecting the fingerprint recognition effect.

Figure 4:
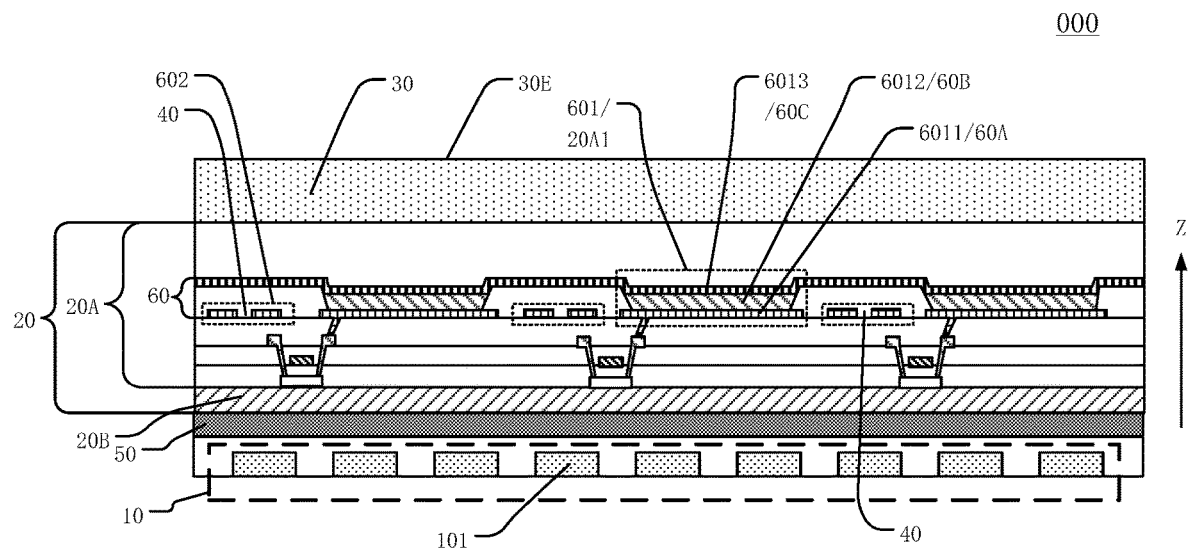
FIG. 4 illustrates another exemplary layer arrangement structure of a display module according to various disclosed embodiments of the present disclosure.

FIG. 4 is a schematic diagram of another exemplary layer distribution structure of a display module according to various disclosed embodiments of the present disclosure (FIG. 4 is only a schematic diagram illustrating the distribution relationship of the local positions of the relevant film layers in this embodiment and does not mean that the actual display module includes only the structure in the figure). In some alternative embodiments, referring to FIGS. 1-2 and FIG. 4 in combination, the display function layer 60 of the display panel 20 may include an imaging structure 602. The imaging structure 602 may include an imaging aperture 40. The imaging structure 602 and the anode 6011 of the light-emitting element 601 may be disposed in the same layer, and the imaging structure 602 may be insulated from the anode 6011.

This embodiment may explain that the imaging structure 602 may be provided on the display function layer 60 of the display panel 20, and the imaging aperture 40 may be opened in the imaging structure 602. In another embodiment, the imaging structure 602 may be provided on the same layer as the anode 6011 of the light-emitting element 601; and the imaging structure 602 may be ensured to be insulated from the anode 6011. For example, although the imaging structure 602 and the anode 6011 of the light-emitting element 601 may be arranged in the same layer and may be made of a same material, they may not be connected to the anode 6011, and may be insulated from each other. Accordingly, when the imaging structure 602 is disposed on the anode layer 60, the effect to the electrical signal of the anode 6011 of the light-emitting element 601 may be avoided.

It can be understood that, since FIG. 4 of the present embodiment shows a cross-sectional view of the imaging structure 602 sectioned from the position of the imaging aperture 40, the imaging structure 602 with the imaging aperture 40 in FIG. 4 is divided into two parts on the left and right sides of the small hole 40 of imaging structure 602. In an actual implementation, the imaging structure 602 may be a block structure in a same layer as the anode 6011 and insulated from the anode 6011, and the imaging aperture 40 may be provided on the imaging structure 602 of the block structure.

Figure 5:
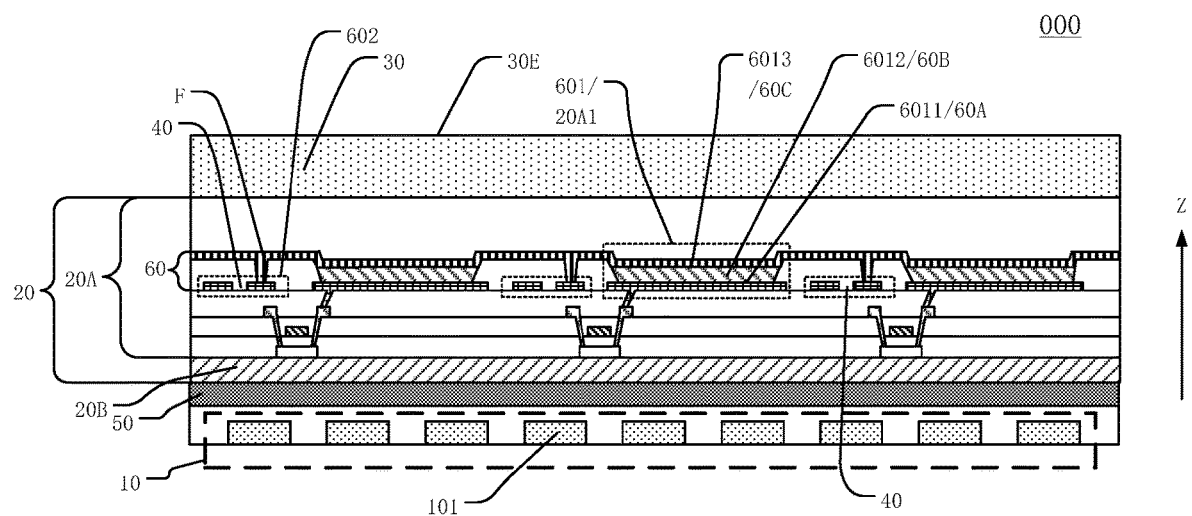
FIG. 5 illustrates another exemplary layer arrangement structure of a display module according to various disclosed embodiments of the present disclosure.

FIG. 5 is a schematic diagram of another exemplary layer distribution structure of a display module provided according to various disclosed embodiments of the present disclosure (FIG. 5 is only a schematic diagram illustrating the distribution relationship of the local positions of the relevant film layers in this embodiment and does not mean that the actual display module only includes the structure in the figure). Referring to FIGS. 1-2 and FIG. 5 in combination, in one embodiment, the display function layer 60 of the display panel 20 may include an imaging structure 602. The imaging structure 602 may include an imaging aperture 40. The imaging structure 602 and the anode 6011 of the light-emitting element 601 may be arranged in the same layer, the imaging structure 602 may be insulated from the anode 6011, and the imaging structure 602 may be electrically connected to the cathode layer 60C.

This embodiment may explain that the imaging structure 602 including the imaging apertures 40 may be provided on the display function layer 60 of the display panel 20. When the imaging structure 602 and the anode 6011 of the light-emitting element 601 are arranged in the same layer and made of a same material, the imaging structure 602 and the anode 6011 may be made to insulate from each other to prevent the imaging structure 602 from affecting the electrical signal of the anode 6011 of the light-emitting element 601 when the anode layer 60A is set, and the imaging structure 602 may be electrically connected to the cathode layer 60C. In one embodiment, the imaging structure 602 can be connected to the cathode layer 60C through a via F. The electrical connection of the cathode layer 60C may be equivalent to that the cathode layer 60C may be connected in parallel with the imaging structure 602, which may be beneficial to reduce the resistance when the cathode layer 60C is configured as the cathode 6013 of the light-emitting element 601. When the display panel 20 is provided with a pixel driving circuit (the pixel driving circuit may be electrically connected to the light-emitting element 601 to drive the light-emitting element 601 to emit light), it may be beneficial to reduce the IR drop of the power signal trace (PVDD) connected to the pixel driving circuit.

Figure 6:
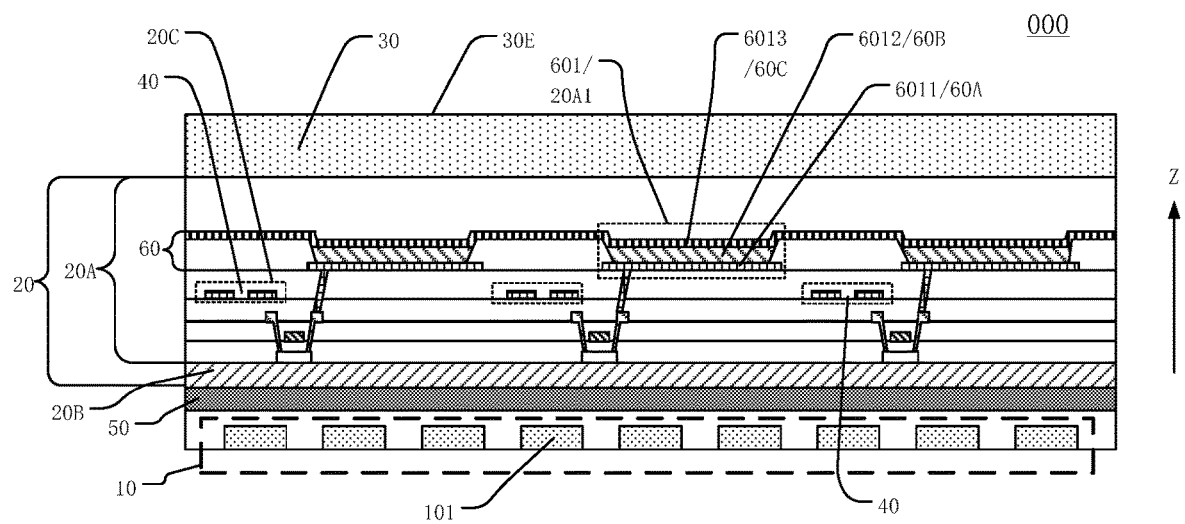
FIG. 6 illustrates another exemplary layer arrangement structure of a display module according to various disclosed embodiments of the present disclosure.

FIG. 6 is a schematic diagram of another exemplary layer distribution structure of a display module according to various disclosed embodiments of the present disclosure (FIG. 6 is only a schematic diagram illustrating the distribution relationship of the local positions of the relevant film layers in this embodiment and does not indicate that the actual display module includes only the structure in the figure). Referring to FIGS. 1-2 and FIG. 6 in combination, in one embodiment, the functional layer 20A may include an anode wire 20C. The anode wire 20C may be electrically connected to the anode 6011 of the light-emitting element 601, and an imaging aperture 40 may be provided on the anode wire 20C.

This embodiment may explain that the functional layer 20A of the display panel 20 may include an anode wire 20C. The anode wire 20C may be electrically connected to the anode 6011 of the light-emitting element 601 (not shown in the figure). There may be multiple anode wires 20C; and the multiple anode wires 20C may be configured to provide a driving signal for the anode 6011 of each light-emitting element 601. In one embodiment, the anode wire 20C may be arranged in a same layer as the anode 6011 of the light-emitting element 601 (referring to the arrangement of the imaging structure 602 in the same layer as the anode layer 60A in FIG. 4). At this time, the imaging structure 602 with the anode layer 60A in FIG. 4 may be understood as the anode wire 20C of this embodiment). The anode wire 20C may also be disposed on other layers in the functional layer 20A of the display panel 20 except the anode layer 60A (as shown in FIG. 6, the film layer where the anode wire 20C is arranged may be located between the anode layer 60A and the base substrate 20B) to realize the flexible arrangement of the imaging aperture 40 in the functional layer 20A of the display panel 20.

Figure 7:
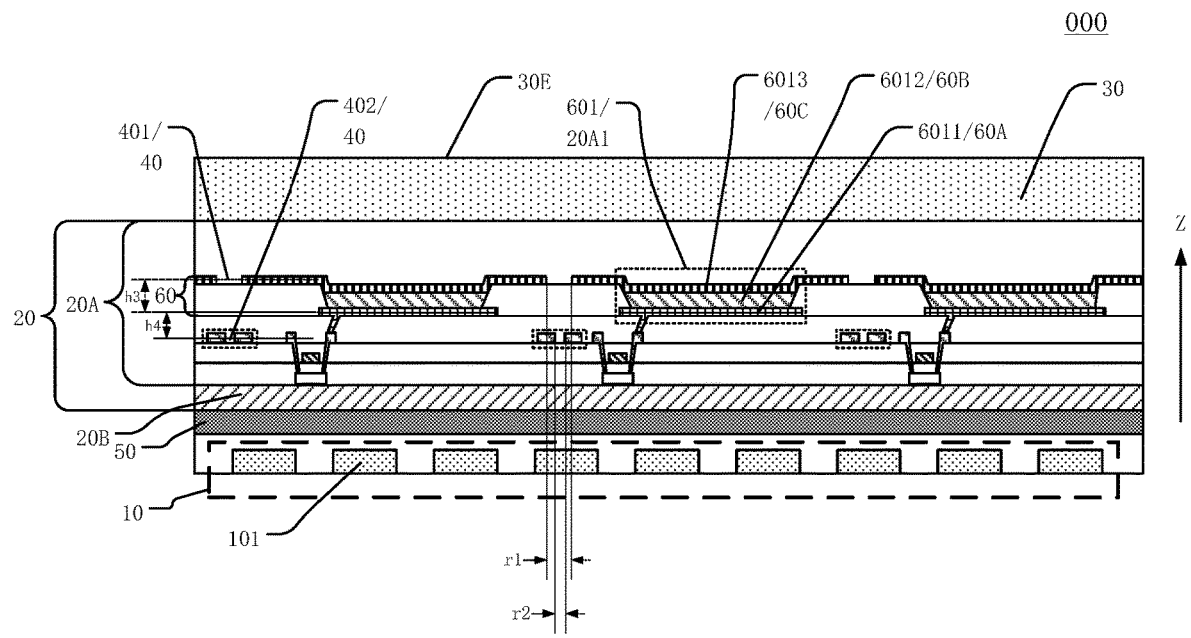
FIG. 7 illustrates another exemplary layer arrangement structure of a display module according to various disclosed embodiments of the present disclosure.

FIG. 7 is a schematic diagram of another exemplary layer distribution structure of a display module according to various disclosed embodiments of the present disclosure (FIG. 7 is only a schematic diagram illustrating the distribution relationship of the local positions of the relevant film layers of this embodiment and does not mean that the actual display module only includes the structure in the figure). Referring to FIGS. 1-2 and FIG. 7, in one embodiment, the functional layer of the display panel 20 may include a display functional layer 60. Along a direction Z perpendicular to the plane where the display panel 20 is located, the display function layer 60 may include an anode layer 60A, a light-emitting layer 60B, and a cathode layer 60C that are stacked together.

The imaging aperture 40 may include a first aperture 401 and a second aperture 402. Along the direction Z perpendicular to the plane where the display panel 20 is located, the anode layer 60A may be disposed between the first aperture 401 and the second aperture 402. The distance h3 between the first aperture 401 and the anode layer 60A may be equal to the distance h4 between the second aperture 402 and the anode layer 60A.

This embodiment may explain that the imaging aperture 40 may include multiple apertures, such as at least a first aperture 401 and a second aperture 402 stacked along a direction Z perpendicular to the plane where the display panel 20 is located. The anode layer 60A of the functional layer 60 may be disposed between the first aperture 401 and the second aperture 402. In one embodiment, the first aperture 401 may be opened in any film layer on the side of the anode layer 60A adjacent to the cover plate 30. For example, a black matrix layer may be included between the display function layer 60 of the display panel 20 and the cover plate 30 to shield light for the metal signal lines (such as scan lines, data lines, etc.) included in the display panel 20. The first aperture 401 may be opened on the black matrix layer (not shown in the drawings), or the first aperture 401 may also be opened on the cathode layer 60C above the anode layer 60A and adjacent to the side of the cover plate 30 (as shown in FIG. 7). The second aperture 402 included in the imaging aperture 40 of this embodiment may be opened in any film layer on the side of the anode layer 60A adjacent to the base substrate 20B, such as each metal film layer where the driving transistor array is disposed (such as the layer where the gate is located, the film layer where the source/drain is located, or the metal layer of the capacitor, etc.). In one embodiment, the film layer where the first aperture 401 and the second aperture 402 are located is not specifically limited. It may only need to satisfy the distance h3 from the first aperture 401 to the anode layer 60A along the direction Z perpendicular to the plane where the display panel 20 is located may be equal to the distance h4 from the second aperture 402 to the anode layer 60A. Accordingly, the actual imaging aperture where the light intersects in the pinhole imaging structure of this embodiment may be understood as the same layer as the anode layer 60A. When the first distance h1 between the surface 30E on the side of the cover plate 30 away from the function layer 20A and the imaging aperture 40 and the second distance h2 between the photosensitive sensor 101 and the imaging aperture 40 are calculated, the anode layer 60A may be configured as the boundary point, which may be equivalent that the position of the anode layer 60A may be understood to be the actual imaging aperture where the light in the aperture imaging structure formed by the plurality of imaging apertures 40 (the first aperture 401 and the second aperture 402) intersects.

In one embodiment, as shown in FIG. 7, when the imaging aperture 40 includes at least a first aperture 401 and a second aperture 402 stacked along a direction Z perpendicular to the plane where the display panel 20 is located, the anode layer 60A of the display function layer 60 of the display panel 20 may be disposed between the first aperture 401 and the second aperture 402. When the first aperture 401 may be opened in any film layer on the side of the anode layer 60A adjacent to the cover plate 30, and the second aperture 402 may be opened in any film layer on the side of the anode layer 60A adjacent to the base substrate 20B, the diameter r1 of the first aperture 401 disposed above may needs to be greater than the diameter r2 of the second aperture 402, and the orthographic projection of the second aperture 402 facing the first aperture 401 may be located within the range of the first aperture 401. Accordingly, the issue that the light reflected to the fingerprint recognition layer 10 from the main touch body (such as fingers) may be blocked when the diameter r1 of the first aperture 401 located above is smaller than the diameter r2 of the second aperture 402 may be avoided. Further, the issue that the light passing through the first small hole 401 cannot completely pass through the second aperture 402 when the diameter r1 of the first aperture 401 located above is equal to the diameter r2 of the second aperture 402 may be avoided. Thus, the light direction of the pinhole imaging may be satisfied, the photosensitive sensor 101 be ensured to have a sufficient amount of light, the loss of light may be avoided, and a better fingerprint recognition function may be achieved.

Figure 8:
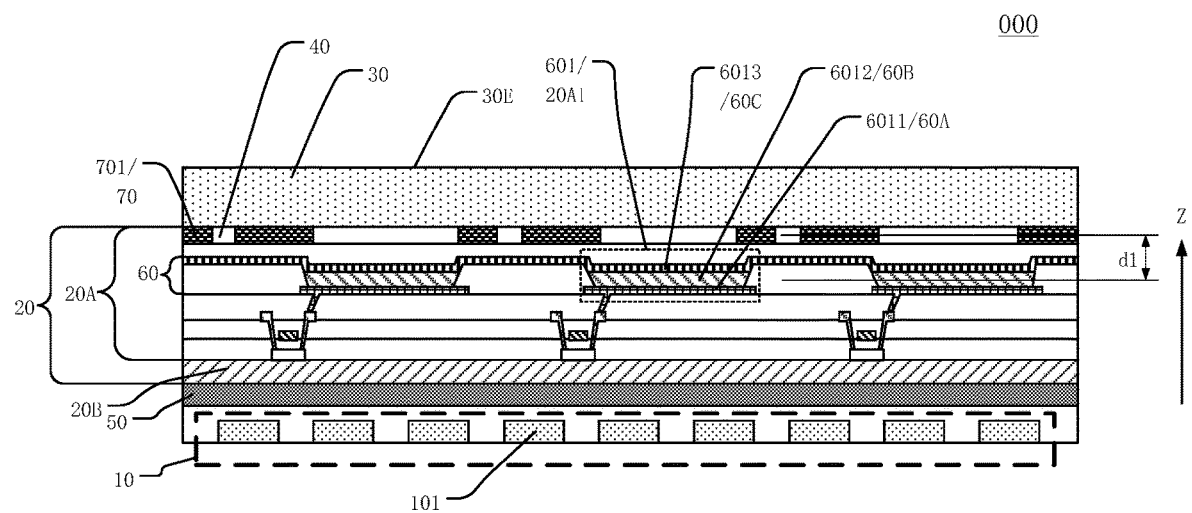
FIG. 8 illustrates another exemplary layer arrangement structure of a display module according to various disclosed embodiments of the present disclosure.

FIG. 8 is a schematic diagram of another exemplary layer distribution structure of a display module consistent with various disclosed embodiments (FIG. 8 is only a schematic diagram illustrating the distribution relationship of the local positions of the relevant film layers of this embodiment and does not indicate that the actual display module only includes the structure in the figure). Referring to FIGS. 1-2 and FIG. 8, in one embodiment, the functional layer 20A of the display panel 20 may include a color filter layer 70. The color filter layer 70 may include at least a black matrix layer 701, and the imaging aperture 40 may be disposed on the black matrix layer 701.

Along the direction Z perpendicular to the plane where the display panel 20 is located, the distance between the black matrix layer 701 and the fingerprint recognition light source 20A1 is d1, and $$\frac{h1+d1}{h1-d1} \leq 1.2.$$

It can be understood that in this embodiment, along the direction Z perpendicular to the plane where the display panel 20 is located, the distance d1 between the black matrix layer 701 and the fingerprint recognition light source 20A1 may be understood as, along the direction perpendicular to the plane where the display panel 20 is located, the distance between the geometric center point of the black matrix layer 701 and the geometric center point of the organic light-emitting portion 6012 of the light-emitting element 601 multiplexed as the fingerprint recognition light source 20A1.

This embodiment may explain that the functional layer 20A provided with the imaging aperture 40 and the fingerprint recognition light source 20A1 may also include the color film layer 70 of the display panel 20, and the display function layer 60 may include multiple light-emitting elements 601 of the display panels 20 for achieving display effect. The color film layer 70 may include at least a black matrix layer 701. The color film layer 70 may be located on the side of the display function layer 60 adjacent to the cover plate 30. The black matrix layer 701 may be configured to shield light for the metal signal lines (such as scanning lines, and data lines, etc.). The light-emitting element 601 of the display function layer 60 may be at least partially multiplexed as a fingerprint recognition light source 20A1. The fingerprint recognition light source 20A1 and the imaging aperture 40 may be arranged on the same layer or substantially the same layer (For example, In FIGS. 3-7, when the imaging aperture 40 and the anode 6011 of the light-emitting element 601 multiplexed as the fingerprint recognition light source 20A1 are on the same layer or are arranged relatively close to the upper and lower positions of the anode 6011, the overall thickness of the display panel 20 is relatively thin. Under such configurations, the fingerprint recognition light source 20A1 and the imaging aperture 40 can be understood as the same layer or substantially the same layer). The fingerprint recognition light source 20A1 and the imaging aperture 40 may be disposed on different layers but, along the direction Z perpendicular to the plane where the display panel 20 is located, the distance between the fingerprint recognition light source 20A1 and the imaging aperture may have to be within a certain range. In this embodiment, the functional layer 20A of the display panel 20 may include a color filter layer 70. The color filter layer 70 may include at least a black matrix layer 701. The imaging aperture 40 may be disposed in the black matrix layer 701. Along the direction Z perpendicular to the plane where the display panel 20 is located, the distance between the black matrix layer 701 and the fingerprint recognition light source 20A1 may be d1, and $$\frac{h1+d1}{h1-d1} \leq 1.2.$$

At this time, the impact of the vertical distance d1 between the imaging aperture 40 and the fingerprint recognition light source 20A1 on the fingerprint recognition may be negligible. For example, the fingerprint recognition light source 20A1 and the imaging aperture 40 in the aperture imaging structure may be disposed on different layers, and the height difference d1 between the two different layers may only need to satisfy $$\frac{h1+d1}{h1-d1} \leq 1.2.$$

At this time, the value of d1 may be relatively small compared to the value of the object distance of the pinhole imaging that is twice the first distance $$\frac{h1+d1}{h1-d1} \leq 1.2,$$

may be converted to $$d1 \leq \frac{1}{11}h1 \bigg).$$

Thus, the object distance of the pinhole imaging may still be understood as the vertical distance between the imaging aperture and the first reflection image R1 formed by the fingerprint recognition light source 20A1 on the side of the cover plate 30 away from the functional layer 20A, for example, twice the first distance h1. Such a configuration may avoid affecting the transmission of the fingerprint recognition light and may also avoid affecting the light flux received by the photosensitive sensor 101 of the fingerprint recognition layer 10. Accordingly, the accuracy of fingerprint recognition may be improved.

It is understandable that FIG. 8 of this embodiment only takes the imaging aperture 40 in the black matrix layer 701 of the display panel 20 as an example for illustration. When the fingerprint recognition light source 20A1 and the imaging aperture 40 are arranged on different layers, the disposition position of the imaging aperture 40 may include but is not limited to the black matrix layer 701. The imaging aperture 40 may also be disposed on other film layers, and may only need the vertical distance d1 between the imaging aperture 40 and the fingerprint recognition light source 20A1 to satisfy $$\frac{h1+d1}{h1-d1} \leq 1.2;$$

and does not affect the fingerprint recognition effect.

Figure 9:
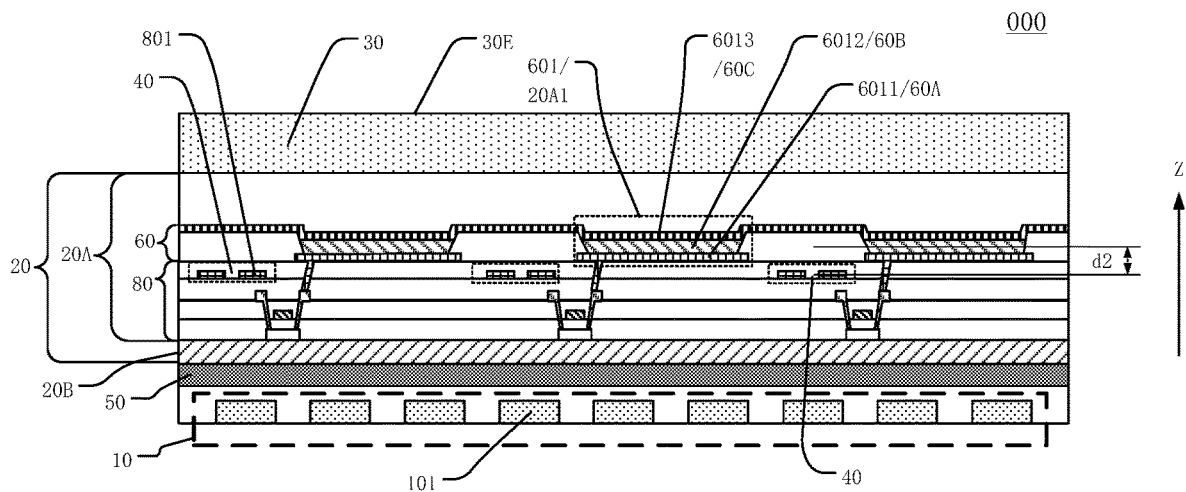
FIG. 9 illustrates another exemplary layer arrangement structure of a display module according to various disclosed embodiments of the present disclosure.

FIG. 9 is a schematic diagram of another exemplary layer distribution of a display module consistent with various disclosed embodiments of the present disclosure (FIG. 9 is only a schematic diagram illustrating the distribution relationship of the local positions of the relevant film layers in this embodiment and does not mean that the actual display module includes only the structure in the figure), referring to FIGS. 1 to 2 and FIG. 9, in one embodiments, the functional layer 20A of the display panel 20 may include a driving transistor array layer 80. The driving transistor array layer 80 may include a first metal layer 801 on the side adjacent to the cover plate 30, and the imaging aperture 40 may be disposed in the first metal layer 801.

Along the direction Z perpendicular to the plane where the display panel 20 is located, the distance between the first metal layer 801 and the fingerprint recognition light source 20A1 may be d2, and $$\frac{h1+d2}{h1-d2} \leq 1.2.$$

It can be understood that in this embodiment, along the direction Z perpendicular to the plane where the display panel 20 is located, the distance d2 between the first metal layer 801 and the fingerprint recognition light source 20A1 may be understood as, along the direction perpendicular to the plane where the display panel 20 is located, the distance between the geometric center point of the first metal layer 801 and the geometric center point of the organic light-emitting portion 6012 of the light-emitting element 601 multiplexed as the fingerprint recognition light source 20A1.

This embodiment may explain that the functional layer 20A provided with the imaging aperture 40 and the fingerprint recognition light source 20A1 may also include the driving transistor array layer 80 of the display panel 20. The display functional layer 60 may include a plurality of light-emitting elements of the display panel 20 for achieving display effects. The driving transistor array layer 80 may include at least the first metal layer 801 on the side adjacent to the cover plate 30. The driving transistor array layer 80 may be disposed on the side of the display function layer 60 adjacent to the base substrate 20B, and the driving transistor array layer 80 may be configured to provide a plurality of driving transistors such that the driving transistors may be electrically connected to the anode 6011 of the light-emitting element 601. The driving transistor array layer 80 may also be configured to set the capacitance of the pixel driving circuit, and the driving transistor array layer 80 may also be configured to configure the driving signal wiring. In one embodiment, the first metal layer 801 on the side of the driving transistor array layer 80 adjacent to the cover plate 30 may be a metal layer of a capacitor, or a source/drain metal layer. This embodiment is not specifically limited, and may only need to satisfy that, along the direction Z perpendicular to the plane where the display panel 20 is located, the first metal layer 801 is the metal film layer closest to the light-emitting element 601 among the various film layers included in the driving transistor array layer 80, such that the value of d2 may be as small as possible. The light-emitting element 601 of the display functional layer 60 may be at least partially multiplexed as the fingerprint recognition light source 20A1, and the fingerprint recognition light source 20A1 and the imaging aperture 40 may be arranged in the same layer or substantially the same layer (as shown in FIGS. 3-7, when the imaging aperture 40 and the anode 6011 of the light-emitting element 601 that is multiplexed as the fingerprint recognition light source 20A1 is disposed on a same layer or is arranged relatively close to the upper or lower position of the anode 6011, because the overall thickness of the display panel 20 itself may be relatively thin, the fingerprint recognition light source 20A1 and the imaging aperture 40 may be understood as on the same layer or basically the same layer). The fingerprint recognition light source 20A1 and the imaging aperture 40 may also be disposed on different layers, but the distance between the two along the direction Z perpendicular to the plane where the display panel 20 is located may have to be within a certain range. In this embodiment, the functional layer 20A of the display panel 20 may include a driving transistor array layer 80. The driving transistor array layer 80 may include a first metal layer 801 on the side adjacent to the cover plate 30. The imaging aperture 40 may be disposed on the first metal layer 801 and, along the direction Z perpendicular to the plane where the display panel 20 is located, the distance between the first metal layer 801 and the fingerprint recognition light source 20A1 may be referred to as d2, and $$\frac{h1+d2}{h1-d2} \leq 1.2.$$

Under such a configuration, the vertical distance d2 between the imaging aperture 40 and the fingerprint recognition light source 20A1 may have a negligible impact on the fingerprint recognition. For example, when the fingerprint recognition light source 20A1 and the imaging aperture 40 in the aperture imaging structure may be located on different layers and the height difference d2 between the two may only need to satisfy $$\frac{h1+d2}{h1-d2} \leq 1.2,$$

the value of d2 is very small compared with the object distance of the pinhole imaging of twice the first distance h1

$$\frac{h1+d2}{h1-d2} \leq 1.2,$$

can be converted as $$d2 \leq \frac{1}{11}h1 \bigg).$$

The objective distance of the pinhole imaging can still be understood as the vertical distance between the imaging aperture and the first reflection images R1 formed by the fingerprint recognition light source 20A1 on the side of the cover 30 away from the functional layer 20A, that is, twice the first distance h1. Such a configuration may avoid affecting the transmission of the fingerprint recognition light, and may also avoid affecting the light flux received by the photosensitive sensor 101 of the fingerprint recognition layer 10. Accordingly, the accuracy of fingerprint recognition may be improved.

It is understandable that FIG. 9 of the present embodiment only takes the first metal layer 801 adjacent to the cover plate 30 in the driving transistor array layer 80 of the display panel 20 with the imaging aperture 40 as an example for illustration. When the fingerprint recognition light source 20A1 and the imaging aperture 40 are disposed in different layers, the position of the imaging aperture 40 may include, but may be not limited to the first metal layer 801. The imaging aperture 40 may also be disposed on other film layers and may only need to meet the requirements that the vertical distance d2 between the imaging aperture 40 and the fingerprint recognition light sources 20A1 may be within the range of $$\frac{h1+d2}{h1-d2} \leq 1.2,$$

and the fingerprint recognition effect may not be affected.

Figure 10:
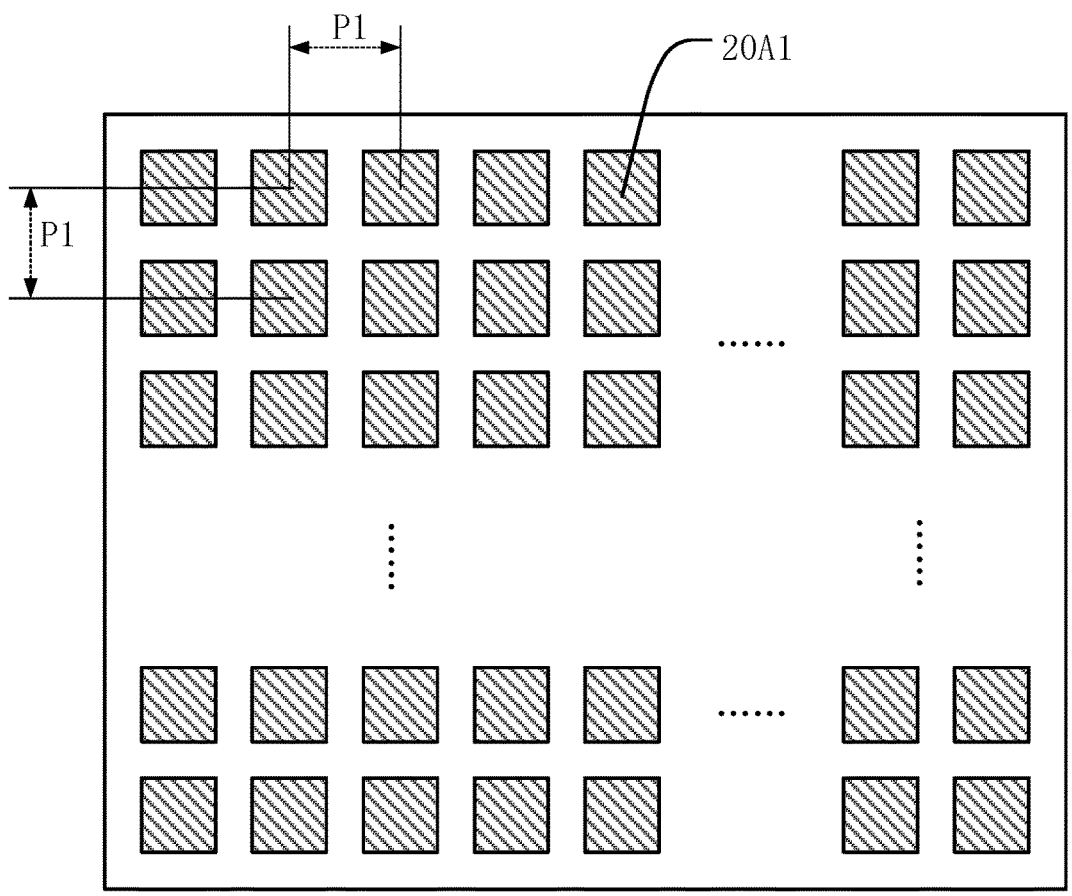
FIG. 10 illustrates an exemplary arrangement structure of the fingerprint recognition light sources of a display module according to various disclosed embodiments of the present disclosure.
Figure 11:
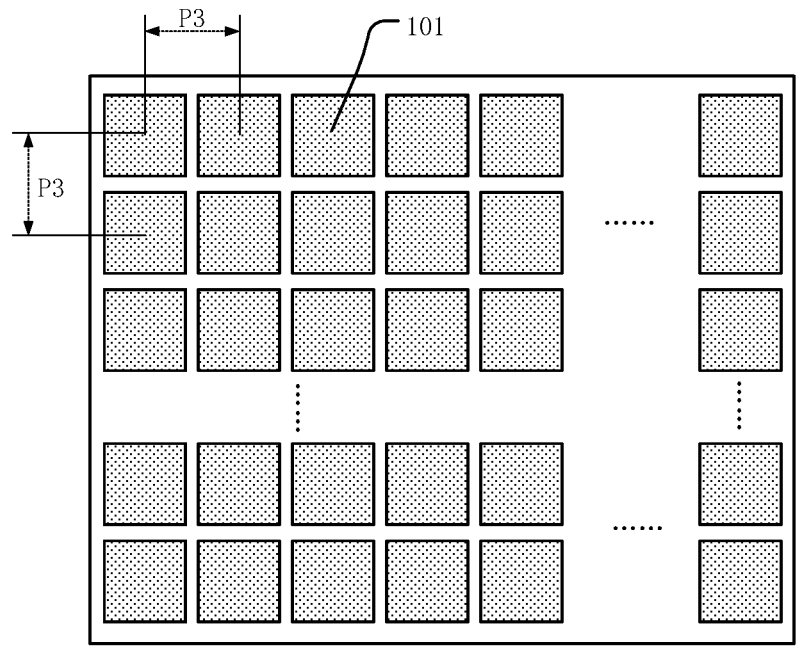
FIG. 11 illustrates an exemplary arrangement structure of the photosensitive sensors under a same viewing angle as FIG. 10 according to various disclosed embodiments of the present disclosure.

FIG. 10 illustrates an exemplary distribution of fingerprint recognition light sources consistent with various disclosed embodiments of the present disclosure. FIG. 11 illustrates an exemplary distribution of the photosensitive sensors in the display module at the same viewing angle as that of FIG. 10 according to various disclosed embodiments of the present disclosure. Referring to FIGS. 1-2 and FIGS. 10-11, in one embodiment, a plurality of fingerprint recognition light sources 20A1 may be arranged as an array, and a plurality of photosensitive sensors 101 may be arranged as an array.

Figure 12:
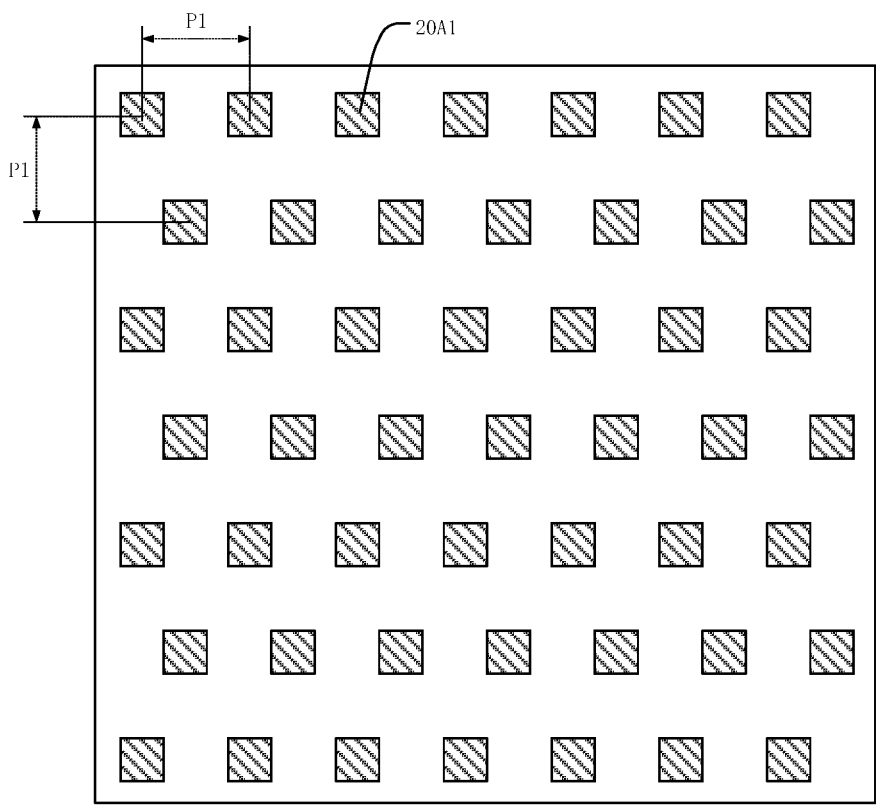
FIG. 12 illustrates an arrangement structure of the fingerprint recognition light sources under a same viewing angle as FIG. 11.

This embodiment may explain that the arrangement of the fingerprint recognition light sources 20A1 of the display module 000 lit during the fingerprint recognition stage may be an array arrangement, and the plurality of photosensitive sensors 101 for the fingerprint recognition may also be arranged as an array. In one embodiment, as shown in FIGS. 10-11, the array arrangement of the plurality of fingerprint recognition light sources 20A1 and the array arrangement of the plurality of photosensitive sensors 101 may be same and the arrangement directions may be parallel (may refer to that the array arrangement may be parallel along row direction and parallel along column direction). When performing a simulation experiment on the light-receiving distribution on the surface of the photosensitive sensors 101 of the fingerprint recognition layer 10 on the display module 000 of this embodiment, under the premise that other conditions are the same (for example, when the value of K is the same), the display module 000 adopts the arrangement structure of the fingerprint recognition light sources 20A1 in FIG. 10 to be combined with the arrangement structure of the photosensitive sensors 101 in FIG. 11, and the arrangement structure of the fingerprint recognition light source 20A1 in FIG. 12 may be similar to the arrangement structure of the photosensitive sensors 101 of FIG. 11 in combination. FIG. 12 is a schematic diagram of another arrangement structure of the fingerprint recognition light sources in the display module provided in the related art under the same viewing angle as that of FIG. 11. When observing the arrangement structure of the multiple fingerprint recognition light sources 20A1 in FIG. 12 under the same viewing angle as in FIG. 11, the multiple fingerprint recognition light sources 20A1 in FIG. 12 are not arranged in an array of rows and columns. Finally, in the simulation diagram obtained by combining FIG. 11 and FIG. 12, the light receiving uniformity on the surface of the photosensitive sensors 101 may be not as desired. However, in the simulation diagram obtained by the combination of FIG. 10 and FIG. 11, not only the surface light receiving uniformity of the photosensitive sensors 101 in a local position may be better, but also the light receiving uniformity of the whole surface of the light sensors 101 of the entire display module 000 may be better. Accordingly, the fingerprint recognition performance of the display module 000 may be improved.

Figure 13:
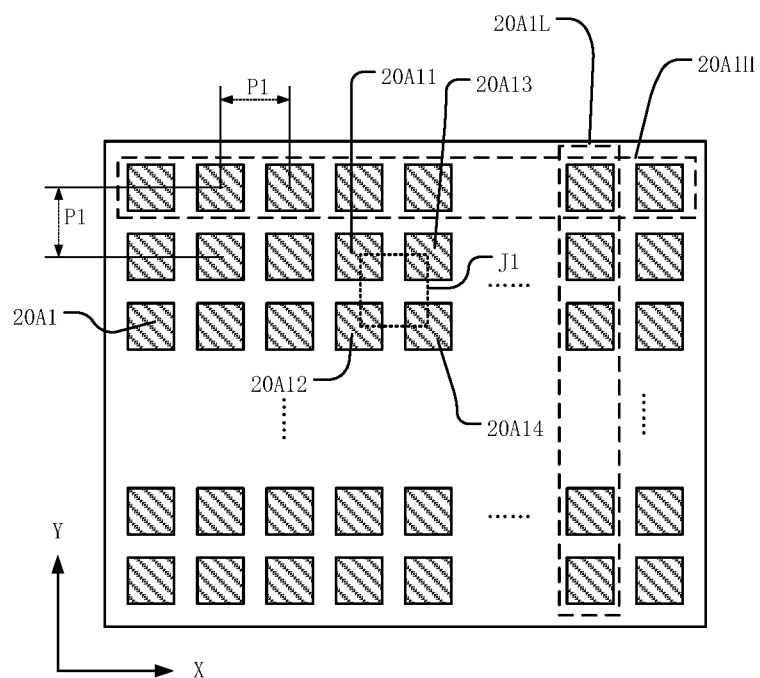
FIG. 13 illustrates another exemplary arrangement structure of the fingerprint recognition light sources of an exemplary display module according to various disclosed embodiments of the present disclosure.
Figure 14:
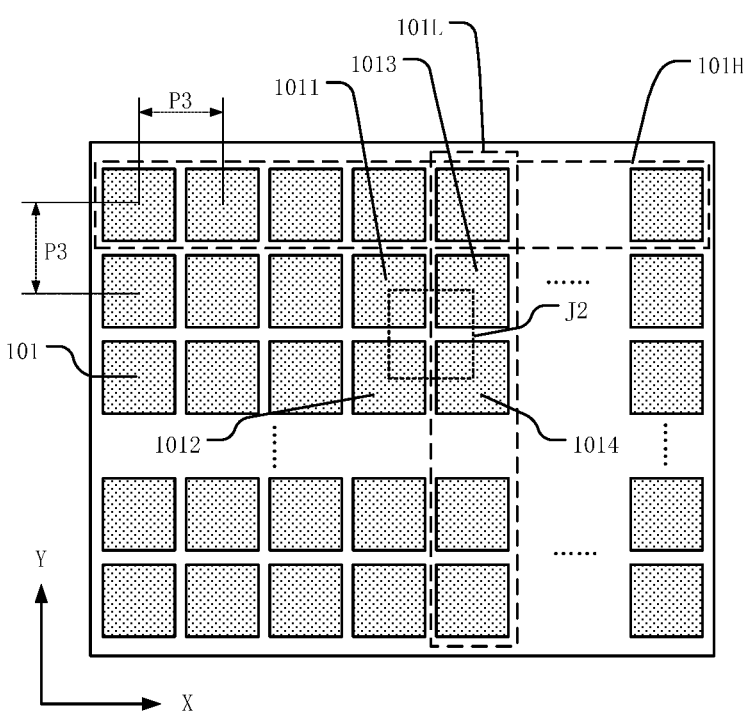
FIG. 14 illustrates an exemplary arrangement structure of the photosensors under a same viewing angle as FIG. 13 according to various disclosed embodiments of the present disclosure.

FIG. 13 illustrates another exemplary distribution structure of the fingerprint recognition light sources consistent with various disclosed embodiments of the present disclosure. FIG. 14 illustrates another exemplary distribution structure of the photosensitive sensors in the display module at the same viewing angle as that of FIG. 13 according to various disclosed embodiments of the present disclosure. Referring to FIGS. 1-2 and FIGS. 13-14, in one embodiment, a plurality of fingerprint recognition light sources 20A1 may be arranged in sequence along the first direction X to form a row of fingerprint recognition light sources 20A1H; a plurality of fingerprint recognition light sources 20A1 may be sequentially arranged along the second direction Y to form a row of fingerprint recognition light sources 20A1L; a plurality of photosensitive sensors 101 may be sequentially arranged along the first direction X to form a row of photosensitive sensors 101H; and a plurality of photosensitive sensors 101 may be sequentially arranged along the second direction Y to form a row of photosensitive sensors 101L. The first direction X and the second direction Y may intersect. In one embodiment, the first direction X and the second direction Y may be perpendicular to each other along a direction parallel to the plane where the display panel 20 is located.

Along the first direction X, the m-th fingerprint recognition light source 20A11 in the n-th row and the m-th fingerprint recognition light source 20A12 in the (n+1)-th row may overlap in the second direction Y. The m-th photosensitive sensor 1011 in the n-th row may overlap the m-th photosensitive sensor 1012 in the (n+1)-th row in the second direction Y. n and m may be positive integers.

This embodiment may explain that the plurality of fingerprint recognition light sources 20A1 may be arranged as an array, and the plurality of photosensitive sensors 101 may also be arranged as an array. The array arrangement structure of the plurality of fingerprint recognition light sources 20A1 and the array arrangement structure of the plurality photosensitive sensors 101 may be same and may be parallel to each other. Such a structure may refer that a plurality of fingerprint recognition light sources 20A1 may be sequentially arranged along the first direction X to form a row of fingerprint recognition light sources 20A1H, and a plurality of fingerprint recognition light sources 20A1 may be sequentially arranged along the second direction Y to form a row of fingerprint recognition light sources 20A1L. Accordingly, a structure in which multiple rows of fingerprint recognition light sources 20A1L are sequentially arranged along the first direction X and multiple rows of fingerprint recognition light sources 20A1H are sequentially arranged in the second direction Y may be formed. At this time, the plurality of photosensitive sensors 101 of the fingerprint recognition layer 10 may be sequentially arranged to form a row of photosensitive sensors 101H along the first direction X, and a plurality of photosensitive sensors 101 may be arranged in sequence along the second direction Y to form a column of photosensitive sensors 101L, and finally, a structure in which multiple columns of photosensitive sensors 101L are arranged in sequence along the first direction X, and multiple rows of photosensitive sensors 101L are sequentially arrange along the second direction Y may be formed. As shown in FIG. 13, counting along a direction same as the first direction X (from left to right in the figure), the m-th fingerprint recognition light source 20A11 in the n-th row and the m-th fingerprint recognition light source 20A12 in the (n+1)-th row may overlap each other. Further, as shown in FIG. 14, counting along a direction same as the first direction X (from left to right in the figure), the m-th photosensitive sensor 1011 in the n-th row and the m-th photosensitive sensor 1012 in the (n+1)-th row may overlap each other in the second direction Y (n and m may be positive integers), such that the multiple fingerprint recognition light sources 20A1 may be arranged as an array, and the multiple photosensitive sensors 101 may also be arranged as an array.

In one embodiment, as shown in FIG. 13 and FIG. 14, along the first direction X, and counting along the same direction (from left to right in the figure), the pattern enclosed by the connection line of the geometric centers of the m-th fingerprint recognition light source 20A11 in the n-th row, the (m+1)-th fingerprint recognition light source 20A13 in the n-th row, the m-th fingerprint recognition light source 20A12 in the (n+1)-th row and the (m+1)-th fingerprint recognition light source 20A14 in the (n+1)-th row may be configured as a first pattern J1. Similarly, along the first direction X and counting along the same direction (from left to right in the figure), the pattern enclosed by the connection line of the geometric centers of the m-th photosensitive sensor 1011 in the n-th row, the (m+1)-th photosensitive sensor 1013 in the n-th row, the m-th photosensitive sensor 1012 in the (n+1)-th row and the (m+1)-th photosensitive sensor 1014 in the (n+1)-th row may be referred to as a second pattern J2. The first pattern J1 and the second pattern J2 may be similar patterns. Further, the first pattern J1 and the second pattern J2 may be both squares, and the sides of the square may extend along the same direction. For example, the first figure J1 and the second pattern J2 may be two similar patterns with the same corresponding angles and the same ratio of the corresponding sides such that the multiple fingerprint recognition light sources 20A1 may be arranged as an array, and the multiple photosensitive sensors 101 may be also arranged as an array. Further, the array arrangement structure of the multiple fingerprint recognition light sources 20A1 and the array arrangement structure of the plurality of photosensitive sensors 101 may be kept parallel to each other in the same row direction and parallel to each other in the same column direction. Accordingly, the uniformity of the light on the surface of the photosensitive sensors 101 of the entire display module 000 may be improved; and the fingerprint recognition performance of the display module 000 may be improved.

Figure 15:
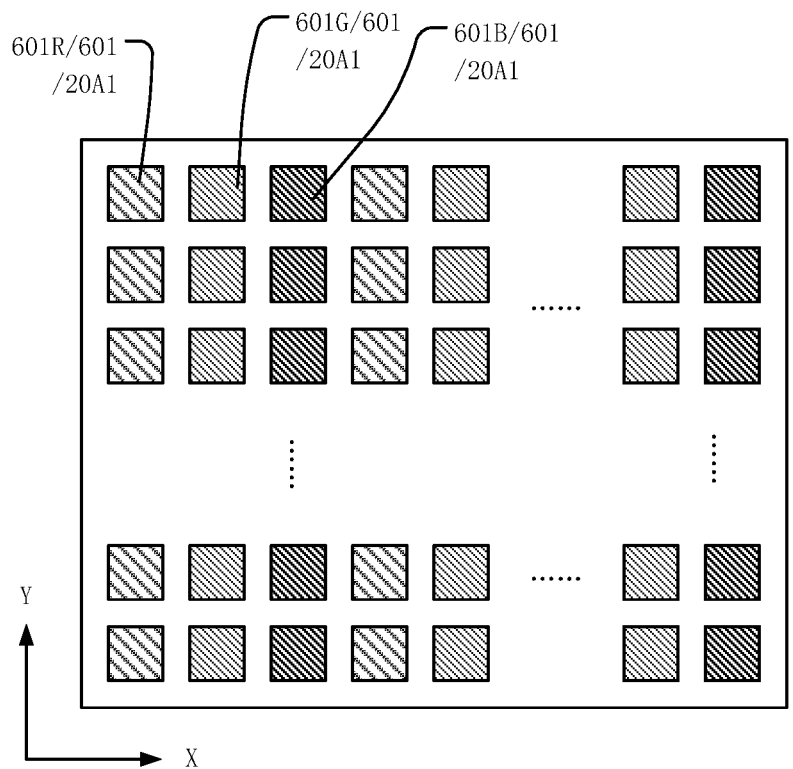
FIG. 15 illustrates an exemplary arrangement structure of a plurality of light-emitting devices according to various disclosed embodiments of the present disclosure.

In one embodiment, the light-emitting elements 601 of the display panel 20 may be at least partially multiplexed as the fingerprint recognition light sources 20A1. Therefore, the arrangement of the multiple light-emitting elements 601 in the display panel 20 may be an array arrangement structure as shown in FIG. 15. FIG. 15 is a schematic diagram of an exemplary arrangement structure of a plurality of light-emitting elements provided by an embodiment of the present disclosure. As show in FIG. 15, the plurality of light-emitting elements 601 may include a plurality of red light-emitting elements 601R, blue light-emitting elements 601B, and green light-emitting elements 601G with different colors and arranged in an array. Referring to FIG. 13, FIG. 14 and FIG. 15, the fingerprint recognition light source 20A1 lit during the fingerprint recognition phase may be all the light-emitting elements 601, thus the array of the fingerprint recognition light sources 20A1 in the same arrangement as the photosensitive sensors 101 may be formed.

Figure 16:
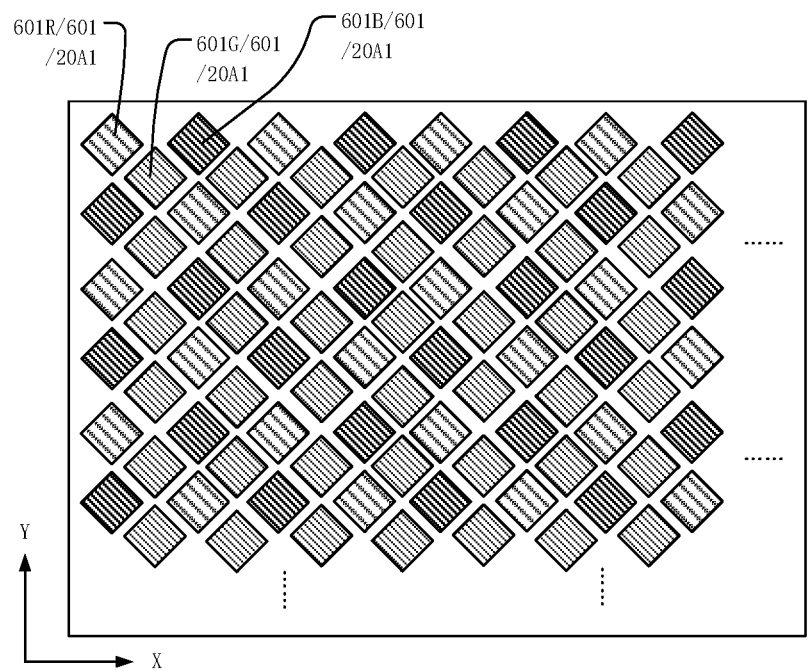
FIG. 16 illustrates another exemplary arrangement structure of a plurality of light-emitting devices according to various disclosed embodiments of the present disclosure.

In another embodiment, the light-emitting elements 601 of the display panel 20 may be at least partially multiplexed as the fingerprint recognition light sources 20A1. Thus, the arrangement of the multiple light-emitting elements 601 in the display panel 20 may be a non-array arrangement as shown in FIG. 16. FIG. 16 is a schematic diagram of another exemplary arrangement structure of multiple light-emitting elements provided by an embodiment of the present disclosure. As shown in FIG. 16, the multiple light-emitting elements 601 may include red light-emitting elements 601R, blue light-emitting elements 601B, and green light-emitting elements 601G of different colors (the arrangement of the light-emitting elements 601 of FIG. 16 may be understood as a windmill-type arrangement structure in which the red light-emitting elements 601R and the blue light-emitting elements 601B may surround the green light-emitting elements 601G). Referring to FIG. 13, FIG. 14, and FIG. 16, the fingerprint recognition light source 20A1 that is lit during the fingerprint recognition phase may be a partial number of light-emitting elements 601. Further, in one embodiment, only the green light-emitting elements 601G of the multiple light-emitting elements 601 may be selected to light up. Accordingly, not only the fingerprint recognition light sources 20A1 may be formed as an array same as the arrangement as the photosensitive sensors 101. Further, because the material properties of the green light-emitting elements 601G themselves may determine their life, the service life of the display module may be improved. At the same time, the possible presence of external interference, such as sunlight in the red-light band, may also be avoided by lighting only the green light-emitting elements 601G. Accordingly, the accuracy of the fingerprint recognition may be improved.

Figure 17:
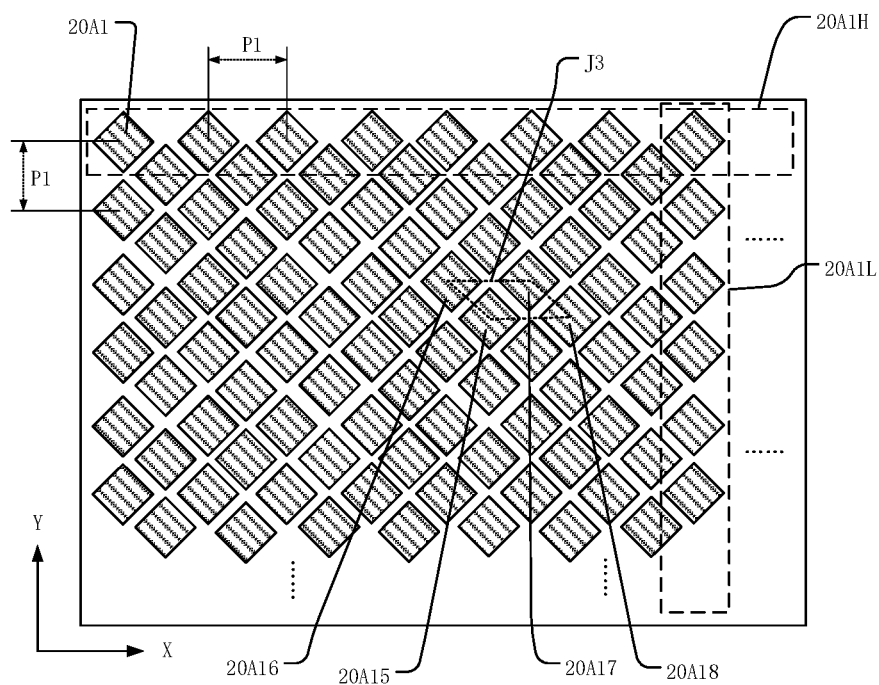
FIG. 17 illustrates another exemplary arrangement structure of the fingerprint recognition light sources of an exemplary display module according to various disclosed embodiments of the present disclosure.
Figure 18:
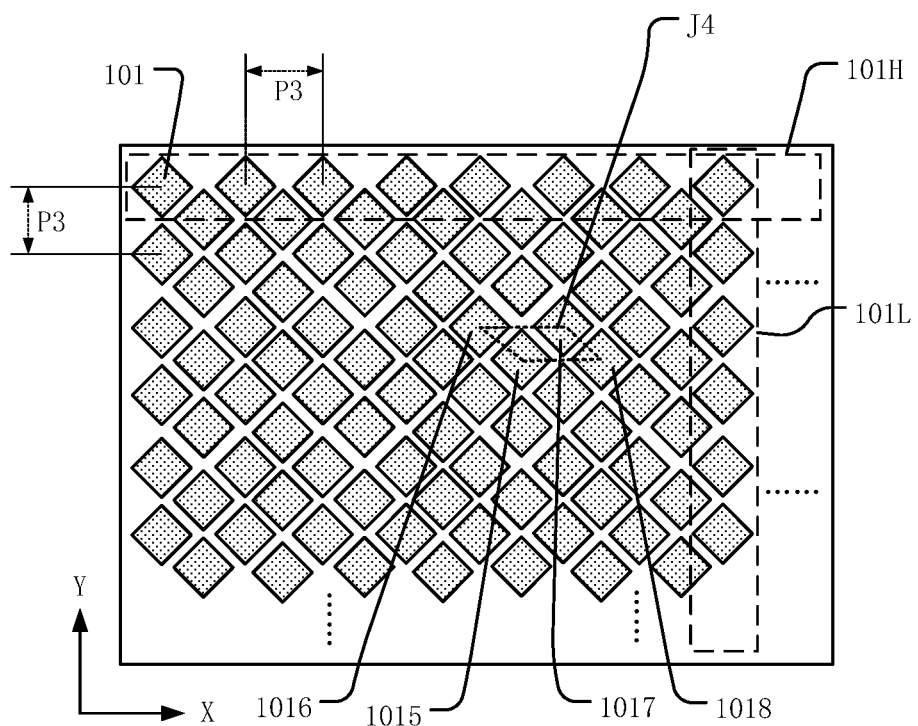
FIG. 18 illustrates an exemplary arrangement structure of the photosensitive sensors under a same viewing angle as FIG. 17 according to various disclosed embodiments of the present disclosure.

FIG. 17 is a schematic diagram of another exemplary arrangement structure of fingerprint recognition light sources in a display module consistent with various disclosed embodiments, and FIG. 18 is a schematic diagram of an exemplary arrangement structure of photosensitive sensors in the display module at the same viewing angle as that of FIG. 17 consistent with various disclosed embodiments of the present disclosure. Referring to FIGS. 1-2 and FIGS. 17-18, in one embodiment, a plurality of fingerprint recognition light sources 20A1 may be arranged in sequence along the first direction X to form a row of fingerprint recognition light sources 20A1H; a plurality of fingerprint recognition light sources 20A1 may be sequentially arranged along the second direction Y to form a row of fingerprint recognition light sources 20A1L; a plurality of photosensitive sensors 101 may be sequentially arranged along the first direction X to form a row of photosensitive sensors 101H and a plurality of photosensitive sensors 101 may be sequentially arranged along the second direction Y to form a row of photosensitive sensors 101L. The first direction X and the second direction Y may intersect. In one embodiment, the first direction X and the second direction Y may be perpendicular to each other along a direction parallel to the plane where the display panel 20 is located.

Along the first direction X, the m-th fingerprint recognition light source 20A15 in the (n+1)-th row may be located between the m-th fingerprint recognition light source 20A16 in the n-th row and the (m+1)-th fingerprint recognition light source 20A17 in the n-th row. The m-th photosensitive sensor 1015 in the (n+1)-th row may be located between the m-th photosensitive sensor 1016 in the n-th row and the (m+1)-th photosensitive sensor 1017 in the n-th row. n and m may be positive integers.

This embodiment may explain that the multiple fingerprint recognition light sources 20A1 may be arranged as an array, and the multiple photosensitive sensors 101 may also be arranged as an array. The array arrangement structure of the multiple fingerprint recognition light sources 20A1 and the array arrangement structure of the multiple photosensitive sensors 101 may be same, and the structures having a parallel arrangement may be that a plurality of fingerprint recognition light sources 20A1 may be sequentially arranged along the first direction X to form a row of fingerprint recognition light sources 20A1H, and a plurality of fingerprint recognition light sources 20A1 may be sequentially arranged along the second direction Y to form a column of fingerprint recognition light sources 20A1L. Accordingly, a structure in which multiple rows of fingerprint recognition light sources 20A1L are sequentially arranged along the first direction X, and multiple columns of fingerprint recognition light sources 20A1H are sequentially arranged in the second direction Y may be formed. At this time, the multiple photosensitive sensors 101 of the fingerprint recognition layer 10 may also be sequentially arranged along the first direction X to form a row of photosensitive sensors 101H, and a plurality of photosensitive sensors 101 may be arranged in sequence along the second direction Y to form a column of photosensitive sensors 101L. Accordingly, a structure in which a plurality of columns of photosensitive sensors 101L are arranged in sequence along the first direction X, and multiple rows of photosensitive sensors 101H are arranged sequentially along the second direction Y may be formed.

As shown in FIG. 17, counting along the same direction as the first direction X (from left to right in the figure), the m-th fingerprint recognition light source 20A15 in the (n+1)-th row may be located between the m-th fingerprint recognition light source 20A16 in the n-th row and the (m+1)-th fingerprint recognition light source 20A17 in the n-th row, such that the same number of fingerprint recognition light sources in the two adjacent columns of fingerprint recognition light sources 20A1L may be staggered along the second direction Y, and the same number of fingerprint recognition light sources in two adjacent rows of fingerprint recognition light source 20A1H may be staggered along the first direction X.

As shown in FIG. 18, counting along the same direction as the first direction X (from left to right in the figure), the m-th photosensitive sensor 1015 in the (n+1)-th row may be located between the m-th photosensitive sensor 1016 in the n-th row and the (m+1)-th photosensitive sensor 1017 in the n-th row (n and m may be positive integers), such that the same number of photosensitive sensors 101L in two adjacent columns of photosensitive sensors may be staggered along the second direction Y, and the same number of photosensitive sensors in two adjacent rows of photosensitive sensors 101H may be staggered along the first direction X. Accordingly, the configuration that multiple fingerprint recognition light sources 20A1 may be arranged as an array may be realized, and the multiple photosensitive sensors 101 may also be arranged as an array.

In another embodiment, referring to FIGS. 17-18, counting along the same direction as the first direction X (from left to right in the figure), the pattern enclosed by the connection line of geometric centers of the m-th finger recognition light source 20A16 in the n-th row, the (m+1)-th fingerprint recognition light source 20A17 in the n-th row, the m-th fingerprint recognition light source 20A15 in the (n+1)-th row, and the (m+1)-th fingerprint recognition light source 20A18 in the (n+1)-th row may be configured a first pattern J3. Similarly, counting along the direction same as the first direction X (from left to right in the figure), the pattern enclosed by the connection line of geometric centers of the m-th photosensitive sensor 1016 in the n-th row, the (m+1)-th photosensitive sensor 1017 in the n-th row, the m-th photosensitive sensor 1015 in the (n+1)-th row, and the (m+1)-th photosensitive sensor 1018 in the (n+1)-th row may be referred to as a second pattern J4. The first pattern J3 and the second pattern J4 may be similar patterns, the first pattern J3 and the second pattern J4 may be both parallelograms, and the opposite sides of the parallelograms may extend along the same direction. For example, the first pattern J3 and the second pattern J4 may be two similar patterns with the same corresponding angles and the same ratio of the corresponding sides. Accordingly, the multiple fingerprint recognition light sources 20A1 may be arranged as an array, and the multiple photosensitive sensors 101 may also be arranged as an array. The array arrangement structure of the fingerprint recognition light sources 20A1 and the array arrangement structure of the plurality of photosensitive sensors 101 may be kept parallel to each other in the same row direction and parallel to each other in the same column direction. Such a configuration may make the overall surface receiving uniformity of the photosensitive sensors 101 of the entire display module 000 to be as desired; and the fingerprint recognition performance of the display module 000 may be improved.

Optionally, all the light-emitting elements 601 of the display panel 20 may be multiplexed as fingerprint recognition light sources 20A1. Therefore, the arrangement of the multiple light-emitting elements 601 in the display panel 20 may be a non-array arrangement as shown in FIG. 16. The multiple light-emitting elements 601 may include red light-emitting elements 601R, blue light-emitting elements 601B, and green light-emitting elements 601G of different colors (the arrangement of the light-emitting elements 601 in FIG. 16 may be understood as a windmill-model arrangement structure of the red light-emitting element 601R and the blue light-emitting element 601B surrounding of the green light-emitting element 601G). At this time, referring to FIG. 17, FIG. 18 and FIG. 16, the fingerprint recognition light sources 20A1 that is lit during the fingerprint recognition phase may be all the light-emitting elements 601, and thus an array of fingerprint recognition light sources 20A1 with the same arrangement as the photosensitive sensors 101 may be formed.

In some embodiments, referring to FIG. 15 and FIG. 16, the fingerprint recognition light sources 20A1 may multiplex at least a portion of the light-emitting elements 601 in the display panel 20. The multiple light-emitting elements 601 may include red light-emitting elements 601R, blue light-emitting elements 601B, and green light-emitting elements 601G of different colors. When performing a fingerprint recognition in the fingerprint recognition phase, the fingerprint recognition light source 20A1 may select the green light-emitting elements 601G for multiplexing.

This embodiment may explain that, regardless of the arrangement of the multiple light-emitting elements 601 of the display panel 20, when the display module 000 of this embodiment performs a fingerprint recognition, the green light-emitting elements 601G of the multiple light-emitting elements 601 may be selected and lit up as the fingerprint recognition light sources 20A1. Because the material properties of the green light-emitting elements 601G itself may determine their service life, the service life of the display module may be increased. At the same time, by lighting only the green light-emitting elements 601G, the external interference, such as sunlight, that may exist in the red light band may be avoided, and the accuracy of fingerprint recognition may be improved.

In some embodiments, referring to FIGS. 1-2, along the direction Z perpendicular to the plane where the display panel 20 is located, the fingerprint recognition light source 20A1 may include a light-emitting surface 20A1E facing the side of the cover plate 30. The distance D3 between the imaging aperture 40 and the light-emitting surface 20A1E may be less than or equal to approximately 5 μm.

This embodiment may explain that, along the direction Z perpendicular to the plane where the display panel 20 is located, the fingerprint recognition light source 20A1 may include a light-emitting surface 20A1E facing the side of the cover plate 30. In one embodiment, the imaging aperture 40 and the light-emitting surface 20A1E may be on a same horizontal plane. In another embodiment, the imaging aperture 40 and the light-emitting surface 20A1E may be on different horizontal planes. At this time, the distance D3 between the imaging aperture 40 and the light-emitting surface 20A1E (the height difference between the imaging aperture 40 and the light-emitting surface 20A1E) may be set to be less than or equal to approximately 5 μm. At this time, the distance D3 between the imaging aperture 40 and the light-emitting surface 20A1E of the fingerprint recognition light source 20A1 may have a negligible effect on the fingerprint recognition. For example, the fingerprint recognition light source 20A1 and the imaging aperture 40 may be in different layers. When the fingerprint recognition light source 20A1 and the imaging aperture 40 are in different layers, the distance D3 between the light-emitting surface 20A1E and the imaging aperture 40 may only need to be less than or equal to 5 μm. At this time, compared with two times of the object distance of the pinhole imaging at the first distance h1, the value of 5 μm may be substantially small. Thus, the object distance of the pinhole imaging may still be understood as the vertical distance between the imaging aperture 40 and the first reflection images R1 formed on the sides of the fingerprint recognition light source 20A1 away from the functional layer 20A of the cover plate 30, for example, twice of the first distance h1. Accordingly, the effect to the transmission of the fingerprint recognition light may be avoided, and the effect to the light flux received by the photosensitive sensor 101 of the fingerprint recognition layer 10 may be avoided. Thus, the accuracy of the fingerprint recognition may be improved.

In some embodiments, referring to FIGS. 1-2 in combination, the vertical distance between the surface 30E on the side of the cover plate 30 away from the functional layer 20A and the imaging aperture 40 may be referred to a first distance h1. The vertical distance between the photosensitive sensor 101 and the imaging aperture 40 may be referred to as a second distance h2, and then $$0.3 < \frac{h2}{h1} < 0.7.$$

This embodiment may explain the vertical distance between the surface 30E on the side of the cover plate 30 away from the functional layer 20A and the imaging aperture 40 (the vertical distance in this embodiment may refer to a distance along the direction perpendicular to the plane where the display panel 20 is located) may be referred to as the first distance h1, the vertical distance between the photosensitive sensor 101 and the imaging aperture 40 may be referred to as the second distance h2, and the first distance h1 may be greater than the second distance h2. Such a configuration may ensure that the object distance of the pinhole imaging (twice the first distance h1) may greater than the image distance (the second distance h2) to ensure the final second image R2 formed on the photosensitive sensor 101 on the side of the imaging aperture 40 away from the first reflection image R1 may be an inverted and reduced real image. Thus, the situation that the final image is an inverted same size real image when the object distance is equal to the image distance may be avoided, or the situation that the final image is an inverted enlarged real image when the object distance is less than the image distance may be avoided. Such situations may cause the second image formed by the first reflection image R1 formed on the side of the fingerprint recognition light source 20A1 away from the cover plate 30 after arriving the photosensitive sensor 101 by the pinhole imaging to be excessively large to cause the overlap of the fingerprint recognition images. Further, $$0.3 < \frac{h2}{h1} < 0.7.$$

In one embodiment, h1=180 um, h2=100 um, $$\frac{h2}{h1} = 0.56.$$

Such a configuration may facilitate the photosensitive sensors 101 of the fingerprint recognition layer 10, in the fingerprint recognition stage, to stitch and identify a complete fingerprint image through the pinhole imaging principle. Thus, the accuracy of the fingerprint recognition may be improved.

In some embodiments, referring to FIGS. 1-2, along a direction Z perpendicular to the plane where the display panel 20 is located, the sum of the thicknesses of the films between the surface 30E of the cover plate 30 on the side away from the functional layer 20A and the imaging aperture 40 may be referred to as h01, and the sum of the thickness of the films between the photosensitive sensor 101 and the imaging aperture 40 may be referred to as h02, and there may be no hollowed-out layer between the cover plate 30 and the photosensitive sensor 101; and then h01=h1, and h02=h2.

This embodiment may explain that, along the direction Z perpendicular to the plane where the display panel 20 is located, when the sum of the thicknesses of all the film layers between the surface 30E of the cover plate 30 on the side away from the functional layer 20A and the imaging aperture 40 may be h01, when the total thickness of all the film layers between the photosensitive sensor 101 and the imaging aperture 40 may be h02, and the hollowed-out layer is not included between the cover plate 30 and the photosensitive sensor 101 (the optional hollowed-out layer may be an air layer containing air, which does not exist the actual film structure), the sum of all film thicknesses h01 between the surface 30E on the side of the cover plate 30 away from the functional layer 20A and the imaging aperture 40 may be configured as the first distance h1 between the surface 30E of the cover plate 30 on a side away from the functional layer 20A and the imaging aperture 40, and the sum of all film thickness h02 between the photosensitive sensor 101 and the imaging aperture 40 may also be configured as the second distance h2 between the photosensitive sensor 101 and the imaging aperture 40. For example, the distance in each vertical direction is the sum of the thicknesses of the film layers. The object distance and the image distance of the pinhole imaging may be obtained by the sum of the thicknesses of the film layers. Such a configuration may simplify the calculation of the ratio K of the distance P3 between the any two adjacent photosensitive sensors 101 and the s times of the distance $$P1\left(s = \frac{h2}{2h1}\right)$$

between any two adjacent fingerprint recognition light sources 20A1. Accordingly, the fingerprint recognition effect may be ensured.

Figure 19:
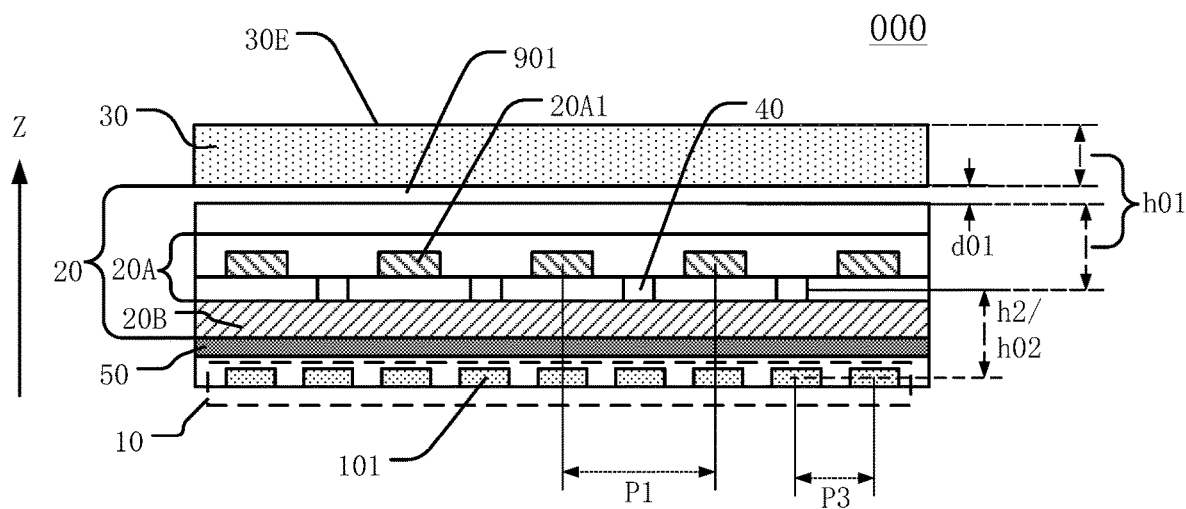
FIG. 19 illustrates another exemplary layer arrangement structure of a display module according to various disclosed embodiments of the present disclosure.

FIG. 19 is a schematic diagram of another exemplary layer distribution structure of a display module provided by an embodiment of the present disclosure (FIG. 19 of this embodiment is only an exemplary drawing of the distribution relationship of the local positions of the relevant film layers in this embodiment and does not mean that the actual display module only includes the structure in the figure). Referring to FIG. 2 and FIG. 19, in one embodiment, along the direction perpendicular to the plane where the display panel 20 is located, the sum of the film thicknesses between the surface 30E on the side of the cover plate 30 away from the functional layer 20A and the imaging aperture 40 may be referred to as h01, and a first hollowed-out layer 901 may be included between the cover plate 30 and the imaging aperture 40. The thickness of the hollowed-out layer 901 may be d01, and then h1=1.5d01+h01.

The sum of the thicknesses of the film layers between the photosensitive sensor 101 and the imaging aperture 40 may be referred to as h02, and the hollowed-out layer may be not included between the photosensitive sensor 101 and the imaging aperture 40. Thus, h02=h2.

This embodiment may explain that, in calculating the ratio K of the distance P3 between any two adjacent photosensitive sensors 101 in the fingerprint recognition layer 10 of this embodiment and s times of the distance $$P1\left(s = \frac{h2}{2h1}\right)$$

between any two adjacent fingerprint recognition light sources 20A1, along the direction Z perpendicular to the plane of the display panel 20, if the sum of the thicknesses of the layers between the surface 30E of the cover plate 30 on the side away from the functional layer 20A and the imaging aperture 40 is h01, a first hollowed-out layer 901 (refers to an air layer containing air, there is no actual film structure) is provided between the cover plate 30 and the imaging aperture 40, and the thickness of the first hollowed-out layer 901 is d01, then h1=1.5d01+h01. For example, by multiplying the thickness d01 occupied by the first hollowed-out layer 901 between the surface 30E on the side of the cover plate 30 away from the functional layer 20A and the imaging aperture 40 by 1.5 times, the refractive index of the film layers between the surface 30E on a side the cover plate 30 away from the functional layer 20A and the imaging aperture 40 may be corrected. The sum of the thicknesses h01 of all the film layers between the surface 30E on the side of the cover plate 30 away from the functional layer 20A and the imaging aperture 40 (except the first hollowed-out layer 901) and 1.5 times of the thickness d01 of the first hollowed-out layer 901 may be added together to be configured as the first distance h1 between the surface 30E on the side of the cover plate 30 away from the functional layer 20A and the imaging aperture 40. The hollowed-out layer may not be included between the photosensitive sensor 101 and the imaging aperture 40, the sum of the thicknesses of all the film layers h02 between the photosensitive sensor 101 and the imaging aperture 40 may still be configured as the second distance h2 between the photosensitive sensor 101 and the imaging aperture 40. Accordingly, the light transmission path of the pinhole imaging after the refractive index correction may be ensured, and the fingerprint recognition effect may be optimized.

Figure 20:
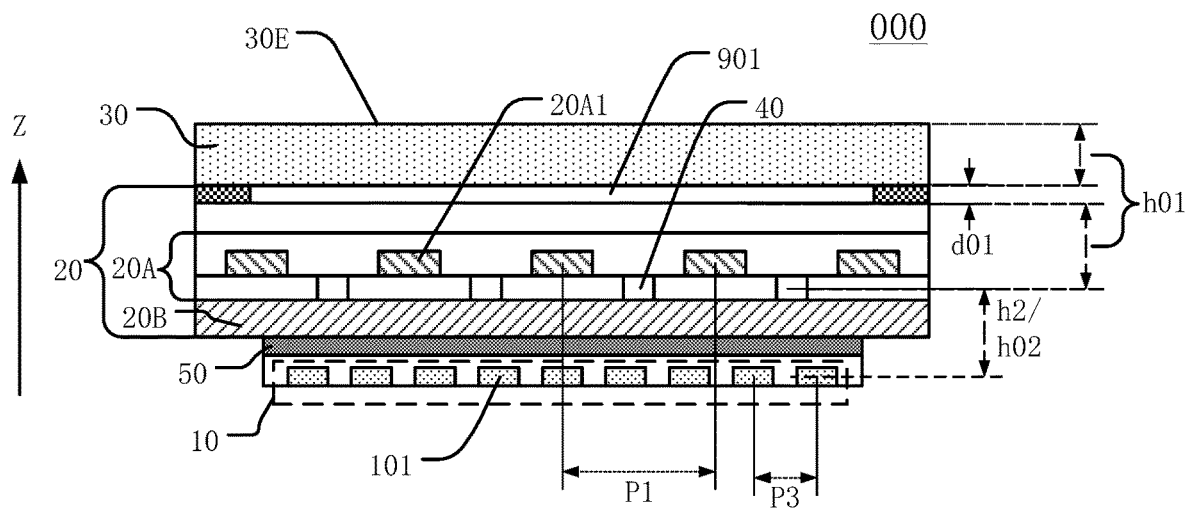
FIG. 20 illustrates another exemplary layer arrangement structure of a display module according to various disclosed embodiments of the present disclosure.

Because FIG. 19 of this embodiment only exemplarily depicts the film layer distribution relationship of the local position of the display module 000, the connection relationship between the two film layers above and below the first hollowed-out layer 901 in FIG. 19 is not shown. FIG. 20 is a schematic diagram of another exemplary layer distribution structure of a display module provided by an embodiment of the present disclosure. As shown in FIG. 20, in the actual structure, the two film layers above and below the first hollowed-out layer 901 are not a completely unconnected independent structure. In the area of FIG. 19 where the fingerprint recognition layer 10 is not disposed, there may be a connection relationship between the two film layers above and below the first hollowed-out layer 901, such as being attached to each other (as shown in FIG. 20), to ensure the integrity of the film structures of the display module 000.

Further, the first hollowed-out layer 901 may be located on the side of the cover plate 30 adjacent to the display panel 20. In a specific implementation, the first hollowed-out layer 901 may be disposed in the imaging aperture 40 at any position between the cover plate 30 and the surface 30E on the side of the cover plate 30 away from the functional layer 20A, and the position of the first hollowed-out layer 901 is not specifically limited in this embodiment. In the specific implementation, the position of the first hollowed-out layer 901 may be indicated based on the specific film structure of the display module 000.

Figure 21:
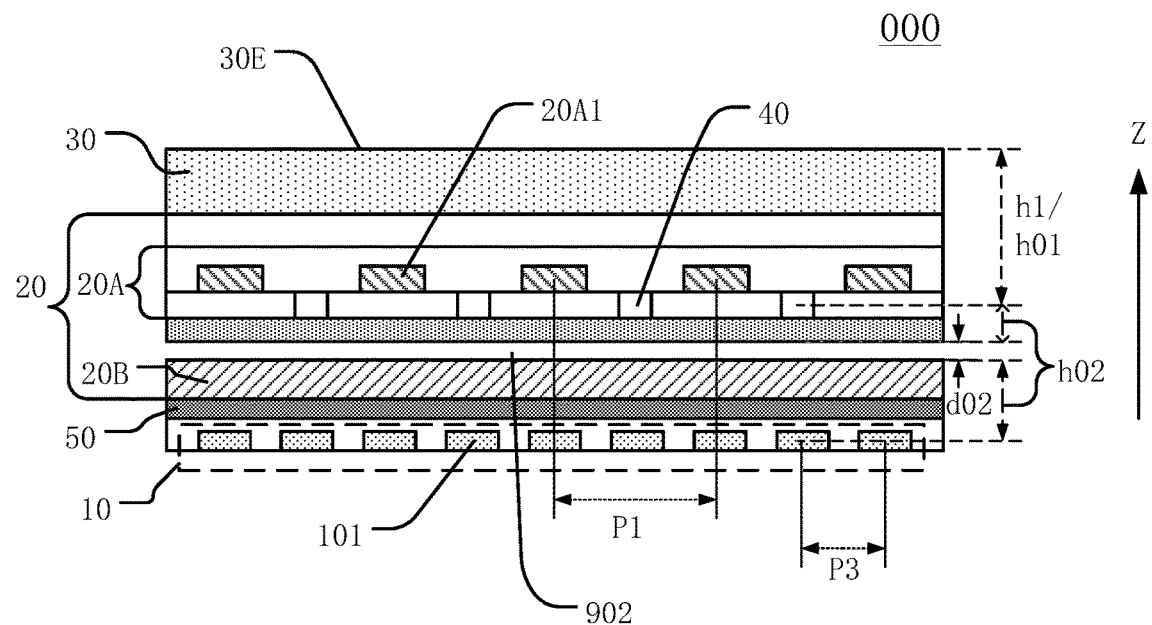
FIG. 21 illustrates another exemplary layer arrangement structure of a display module according to various disclosed embodiments of the present disclosure.

FIG. 21 is a schematic diagram of another exemplary layer distribution structure of a display module provided by an embodiment of the present disclosure (FIG. 21 of this embodiment is only an exemplary drawing of the distribution relationship of the local positions of the relevant film layers in this embodiment and does not mean that the actual display module only includes the structure in the figure). Referring to FIG. 2 and FIG. 21 in combination, in one embodiment, along a direction Z perpendicular to the plane where the display panel 20 is located the sum of the film thicknesses between the surface 30E on the side of the cover plate 30 away from the functional layer 20A and the imaging aperture 40 may be referred to as h01, and a hollowed-out layer may not be included between the cover plate 30 and the imaging aperture 40, then h01=h1;

The sum of the thicknesses of the films between the photosensitive sensor 101 and the imaging aperture 40 may be referred to as h02, a second hollowed-out layer 902 may be included between the photosensitive sensor 101 and the imaging aperture 40, and the thickness of the second hollowed-out layer 902 may be referred to as d02, and then h2=1.5 d02+h02.

This embodiment may explain that, in calculating the ratio K of the distance P3 between any two adjacent photosensitive sensors 101 in the fingerprint recognition layer 10 of this embodiment and s times the distance $$P1\left(s = \frac{h2}{2h1}\right)$$

between any two adjacent fingerprint recognition light sources 20A1, along the direction Z perpendicular to the plane where the display panel 20 is located, if the sum of the film thickness between the surface 30E on the side of the cover plate 30 away from the functional layer 20A and the imaging aperture 40 may be referred to as h01, and the hollowed-out layer is not included between the cover plate 30 and the imaging aperture 40, the total thickness of all the film layers between the surface 30E on the side of the cover plate 30 away from the functional layer 20A and the imaging aperture 40 may be h01, and h01 may still be configured as the first distance h1 between the surface 30E on the side of the cover plate 30 away from the functional layer 20A and the imaging aperture 40. The sum of the film thicknesses between the photosensitive sensor 101 and the imaging aperture 40 may referred to as h02. A second hollowed-out layer 902 may be included between the photosensitive sensor 101 and the imaging aperture 40 (refers to an air layer containing air, and there is no actual film structure). The thickness of the second hollowed-out layer 902 may be referred to as d02, then h2=1.5d02+h02. For example, the refractive index of the film layers between the photosensitive sensor 101 and the imaging aperture 40 may be corrected by multiplying the thicknesses d02 occupied by the second hollowed-out layer 902 between the photosensitive sensor 101 and the imaging aperture 40 by 1.5 times. The sum of the thicknesses h02 of all the film layers (except the second hollowed-out layer 902) between the photosensitive sensor 101 and the imaging aperture 40 may be added with 1.5 times of the thickness d02 of the second hollowed-out layer 902 to be configured as the second distance h2 between the photosensitive sensor 101 and the imaging aperture 40. Accordingly, the light transmission path during pinhole imaging after the refractive index is corrected may be ensured, and the fingerprint recognition effect may be ensured.

Figure 22:
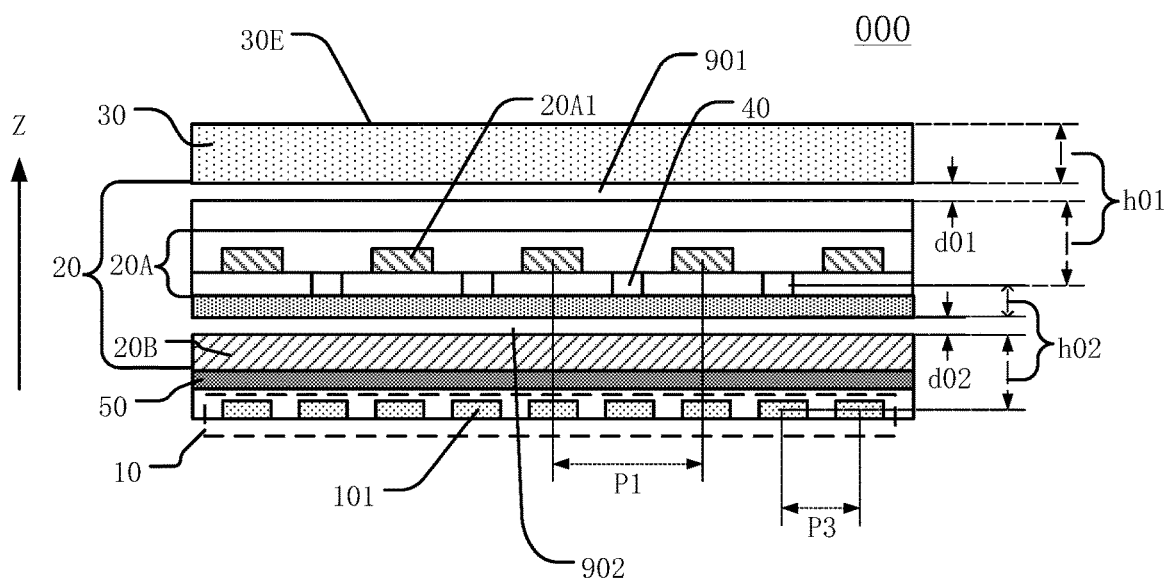
FIG. 22 illustrates another exemplary layer arrangement structure of a display module according to various disclosed embodiments of the present disclosure.

FIG. 22 is a schematic diagram of another exemplary layer distribution structure of a display module provided by an embodiment of the present disclosure (FIG. 22 of this embodiment is an exemplary drawing of the distribution relationship of the local positions of the relevant film layers in this embodiment and does not mean that the actual display module only includes the structure in the figure). Referring to FIG. 2 and FIG. 22 in combination, in one embodiment, along the direction perpendicular to the plane where the display panel 20 is located, the sum of the film thicknesses between the surface 30E on the side of the cover plate 30 away from the functional layer 20A and the imaging aperture 40 may be referred to as h01, and a first hollowed-out layer 901 may be included between the cover plate 30 and the imaging aperture 40. The thickness of the first hollowed-out layer 901 is d01, then h1=1.5d01+h01.

The sum of the thickness of the film layers between the photosensitive sensor 101 and the imaging aperture 40 may be referred to as h02. A second hollowed-out layer 902 may be included between the photosensitive sensor 101 and the imaging aperture 40. The thickness of the second hollowed-out layer 902 may be d02, and then h2=1.5d02+h02.

This embodiment may explains that, in calculating the ratio K of the distance P3 between any two adjacent photosensitive sensors 101 in the fingerprint recognition layer 10 of this embodiment and s times of the distance $$P1\left(s = \frac{h2}{2h1}\right)$$

between any two adjacent fingerprint recognition light sources 20A1, along the direction Z perpendicular to the plane where the display panel 20 is located, if the sum of thicknesses of the layers between the surface 30E at the side of the cover plate 30 away from the functional layer 20A and the imaging aperture 40 is h01, the first hollowed-out layer 901 (refers to an air layer containing air, there is no actual film structure) is provided between the cover plate 30 and the imaging aperture 40, and the thickness of the first hollowed-out layer 901 is d01, and then h1=1.5d01+h01. For example, the refractive index of the film layers between the surface 30E at a side of the cover plate 30 away from the functional layer 20A and the imaging aperture 40 may be corrected by multiplying the thickness d01 occupied by the first hollowed-out layer 901 between the surface 30E on the side of the cover plate 30 away from the functional layer 20A and the imaging aperture 40 by 1.5 times. Further, the sum of the thicknesses h01 of all the film layers between the surface 30E on the side of the cover plate 30 away from the functional layer 20A and the imaging aperture 40 (except the first hollowed-out layer 901) and 1.5 times of the thickness d01 of the first hollowed-out layer 901 may be added together to be configured as the first distance h1 between the surface 30E on the side of the cover plate 30 away from the functional layer 20A and the imaging aperture 40. The sum of the thicknesses of the film layers between the photosensitive sensor 101 and the imaging aperture 40 may be h02, and the second hollowed-out layer 902 (referring to the air layer containing air is included between the photosensitive sensor 101 and the imaging aperture 40, and there is no actual film layer structure) may be included between the photosensitive sensor 101 and the imaging aperture 40, the thickness of the second hollowed-out layer 902 is d02, then h2=1.5d02+h02. For example, the refractive index of the film layers between the photosensitive sensor 101 and the imaging aperture 40 may be corrected by multiplying the thickness d02 occupied by the second hollowed-out layer 902 between the photosensitive sensor 101 and the imaging aperture 40 by 1.5 times, and the sum of the thicknesses of all the film layers h02 (except the second hollowed-out layer 902) between the photosensitive sensor 101 and the imaging aperture 40 and 1.5 times the thickness d02 of the second hollowed-out layer 902 may be added together to be configured as the second distance h2 between the photosensitive sensor 101 and the imaging aperture 40. Thus, the light transmission path during the pinhole imaging after the refractive index correction may be ensured, and the fingerprint recognition effect may be optimized.

Figure 23:
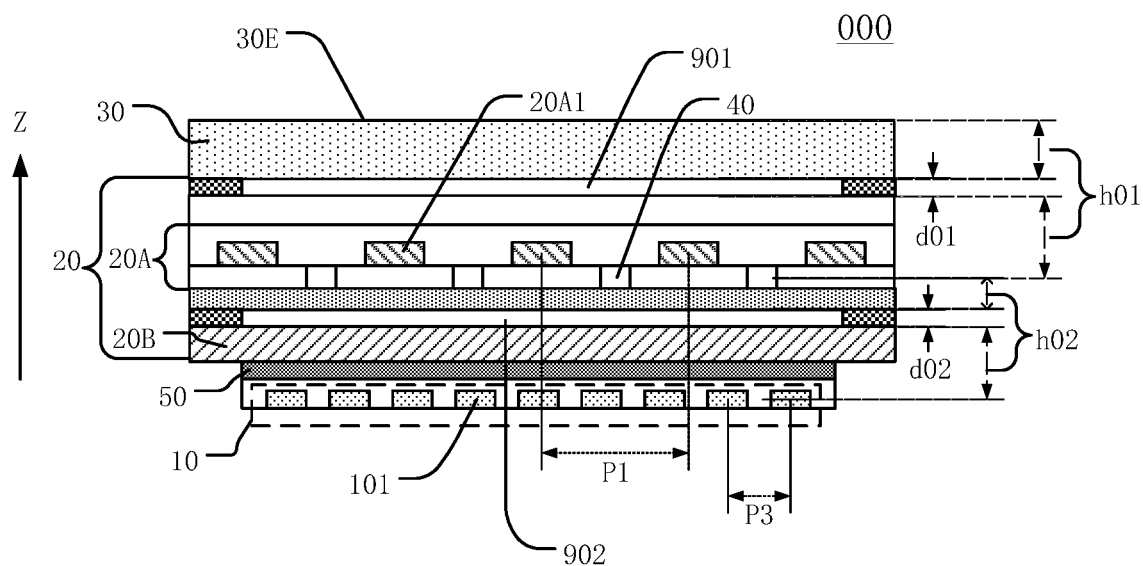
FIG. 23 illustrates another exemplary layer arrangement structure of a display module according to various disclosed embodiments of the present disclosure.

Because FIG. 22 of this embodiment only exemplarily shows the film layer distribution relationship of the local positions of the display module 000, the two film layers above and below the first hollowed-out layer 901 and two film layers above and below the second hollowed-out layer 902 in FIG. 22 do not show the connection relationship. FIG. 23 is a schematic diagram of another exemplary layer distribution structure of a display module provided by the embodiment of the present disclosure. As shown in FIG. 22, in actual structure, the two film layers above and below the first hollowed-out layer 901 may not be completely unconnected independent structures, and the two film layers above and below the second hollowed-out layer 902 may not be completely unconnected independent structures. Some unlabeled region where the fingerprint recognition layer 10 is not disposed may have a certain connection relationship. For example, the two film layers above and below the first hollowed-out layer 901 may be attached to each other, and the two film layers above and below the second hollowed-out layer 902 may be attached to each other (as shown in FIG. 23) to ensure the integrity of the film structure of the display module 000.

In one embodiment, the configuration that the first hollowed-out layer 901 is located on the side of the cover plate 30 adjacent to the display panel 20, and the second hollowed-out layer 902 is located between the base substrate 20B and the imaging aperture 40 is configured as an example. In a specific implementation, the first hollowed-out layer 901 may be disposed anywhere between the imaging aperture 40 and the surface 30E of the cover plate 30 on the side away from the functional layer 20A, and the second hollowed-out layer 902 may be disposed at any position between the photosensitive sensors 101 and the imaging aperture 40, this embodiment does not specifically limit the location of the first hollowed-out layer 901 and the second hollowed-out layer 902. In specific implementation, the positions of the first hollowed-out layer 901 and the second hollowed-out layer 902 may be indicated according to the specific film structure of the display module 000.

Figure 24:
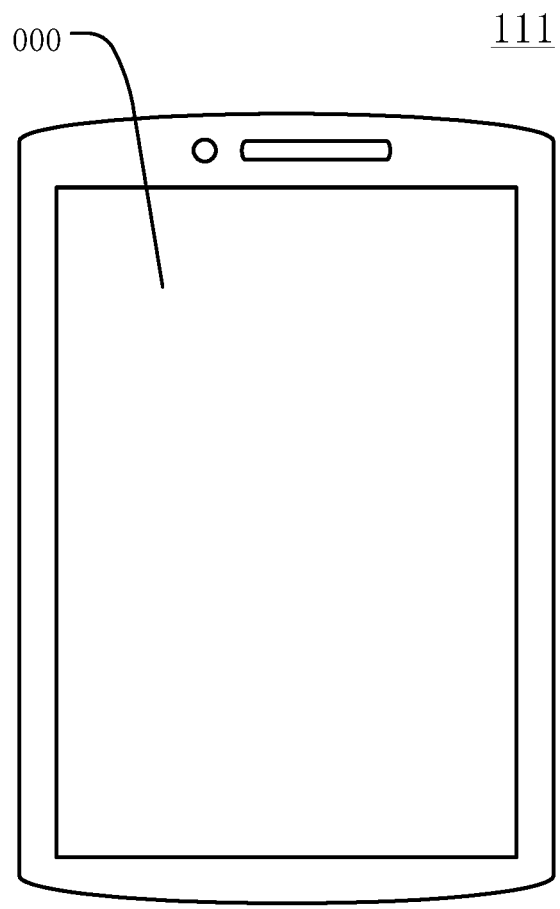
FIG. 24 illustrates a top view of an exemplary display device according to various disclosed embodiments of present disclosure.

The present disclosure also provides a device. FIG. 24 is a schematic top view of an exemplary display device consistent various disclosed embodiments of the present disclosure.

As shown in FIG. 24, the display device 111 provided in this embodiment may include a display module 000. The display module 000 may be a present disclosed display module, or other appropriate display module. In one embodiment, the display device 111 of this embodiment may be an organic light-emitting display device or may also be a flexible display device or a folding screen display device. The embodiment of FIG. 24 only uses a mobile phone as an example to describe the display device 111. The display device 111 provided by the embodiment of the present disclosure may be a computer, a TV, a vehicle-mounted display device, or other display devices 111 with display functions. However, the present invention does not impose specific restrictions on this. The display device 111 provided by the embodiment of the present disclosure may have the beneficial effects of the display module 000 provided by the embodiment of the present disclosure. For details, reference may be made to the specific description of the display module 000 in the foregoing embodiments, which will not be repeated in this embodiment.

It can be seen from the foregoing embodiments that the display module and display device provided by the present disclosure may at least achieve the following beneficial effects.

While the display module provided by the present disclosure is able to realize the display function, it may also include a fingerprint recognition structure for realizing the fingerprint recognition function. The display module may include at least a fingerprint recognition layer, a display panel and a cover plate. The display panel may include at least a functional layer. The fingerprint recognition layer may include a plurality of photosensitive sensors located on the side of the function layer away from the cover plate. The functional layer may include multiple fingerprint recognition light sources and multiple imaging apertures. The light emitted by the fingerprint recognition light sources may be emitted to the surface of the cover plate away from the functional layer, and then reflected by the touch body (such as a finger) in contact with the cover plate, and the fingerprint of the touch subject may be finally imaged onto the photosensitive sensor of the fingerprint recognition layer through the imaging aperture. The ridges and valleys of the fingerprint may be detected by the photosensitive sensors, and then an image for the fingerprint recognition may be formed to complete the fingerprint recognition function. The imaging apertures may be configured to image the fingerprint in contact with the cover plate onto the photosensitive sensors, and the photosensitive sensors may be configured to detect the fingerprint image. In the present disclosure, along a direction parallel to the plane where the display panel is located, the distance between any two adjacent fingerprint recognition light sources may be P1, the distance between any two adjacent photosensitive sensors may be P3, $$K = \frac{2P3 \times h1}{P1 \times h2},$$

and 0.8N<K<1.2N. N may be a positive integer. Such a configuration may make the ratio K of the distance P3 between any two adjacent photosensitive sensors in the fingerprint recognition layer and s times of the distance $$P1\left(s = \frac{h2}{2h1}\right)$$

between the any two adjacent fingerprint recognition light sources 20A1 to have the above-mentioned corresponding relationship to avoid obvious uneven light sensitivity of the photosensitive sensor. Accordingly, the fingerprint recognition light source detected by the photosensitive sensors may be a desired surface light source as uniform as possible, the uniformity of the photosensitivity of the photosensitive sensors may be improved, and the fingerprint recognition performance of the display module may be improved.

Although some specific embodiments of the present disclosure have been described in detail through examples, those skilled in the art should understand that the above examples are only for illustration and not for limiting the scope of the present disclosure. Those skilled in the art should understand that the above embodiments may be modified without departing from the scope and spirit of the present disclosure. The scope of the disclosure may be defined by the appended claims.

What is claimed is:

1. A display module, comprising:
a fingerprint recognition layer;
a display panel; and
a cover plate,
wherein:
the display panel includes a functional layer disposed between the fingerprint recognition layer and the cover plate;
the fingerprint recognition layer includes a plurality of photosensitive sensors;
the functional layer includes a plurality of fingerprint recognition light sources and a plurality of imaging apertures;
the plurality of imaging apertures are configured to image a fingerprint that is in contact with the cover plate onto the plurality of photosensitive sensors;

a vertical distance between a surface of the cover plate at a side away from the functional layer and an imaging aperture of the plurality of imaging apertures is a first distance h1;
a vertical distance between a photosensitive sensor of the plurality of photosensitive sensors and the imaging aperture of the plurality of imaging apertures is a second distance h2;
along a direction parallel to a plane where the display panel is located, a distance between any two adjacent fingerprint recognition light sources is P1, and a distance between any two adjacent photosensitive sensors is P3;

$$K = \frac{2P3 \times h1}{P1 \times h2};$$

0.8N<K<1.2N; and
N is a positive integer.

2. The display module according to claim 1, wherein:
the plurality of fingerprint recognition light sources form a first reflection image on the side of the cover plate away from the functional layer, and the first reflection image forms a second image on the fingerprint recognition layer through the plurality of imaging apertures;
along the direction parallel to the plane where the display panel is located, a distance between any two adjacent first reflection images is the P1, and a distance between any two adjacent second images is the P2; and $$\frac{P1}{P2} = \frac{2h1}{h2}.$$

3. The display module according to claim 1, wherein:
the functional layer includes a display functional layer;
the display functional layer includes a plurality of light-emitting elements;
along a direction perpendicular to the plane where the display panel is located, the display functional layer includes an anode layer, a light-emitting layer and a cathode layer that are stacked together,
the light-emitting element of the plurality of light-emitting elements includes an anode located in the anode layer, an organic light-emitting portion located in the light-emitting layer and a cathode located in the cathode layer; and
the plurality of imaging apertures and the anode layer are arranged in a same layer.

4. The display module according to claim 3, wherein:
an imaging aperture of the plurality imaging apertures is disposed on the anode.

5. The display module according to claim 3, wherein:
the functional layer includes an imaging structure;
the imaging structure includes the plurality of imaging apertures; and
the imaging structure and the anode are disposed in a same layer and insulated from each other.

6. The display module according to claim 5, wherein:
the imaging structure is electrically connected to the cathode layer.

7. The display module according to claim 1, wherein:
the functional layer includes an anode line;
the anode line is electrically connected to the anode; and
an imaging aperture of the plurality imaging apertures is disposed on the anode line.

8. The display panel according to claim 1, wherein:
the functional layer includes a display functional layer;
along a direction perpendicular to the plane where the display panel is located, the display functional layer includes an anode layer, a light-emitting layer and a cathode layer stacked together;
the plurality of imaging apertures include a first aperture and a second aperture;
along the direction perpendicular to the plane where the display panel is located, the anode layer is located between the first aperture and the second aperture; and
a distance between the first aperture and the anode layer is equal to a distance between the second aperture and the anode layer.

9. The display module according to claim 1, wherein:
the functional layer includes a color film layer;
the color film layer at least includes a black matrix layer;
an imaging aperture of the plurality of imaging apertures is disposed in the black matrix layer;
along a direction perpendicular to the plane where the display panel is located, a distance between the black matrix layer and a fingerprint recognition light source of the plurality of fingerprint recognition light sources is d1; and $$\frac{h1+d1}{h1-d1} \leq 1.2.$$

10. The display module according to claim 1, wherein:
the functional layer includes a driving transistor array layer;
the driving transistor array layer includes a first metal layer at a side adjacent to the cover plate;
the plurality of imaging apertures are located in the first metal layer;
along a direction perpendicular to the plane where the display panel is located, a distance between the first metal layer and a fingerprint recognition light source of the plurality of fingerprint recognition light sources is d2; and $$\frac{h1+d2}{h1-d2} \leq 1.2.$$

11. The display module according to claim 1, wherein: 0.9N<K<1.1N.

12. The display module according to claim 1, wherein: K is an integer.

13. The display module according to claim 1, wherein: N≤2.

14. The display module according to claim 1, wherein:
the plurality of fingerprint recognition light sources are arranged as an array; and
the plurality of photosensitive sensors are arranged as an array.

15. The display module according to claim 14, wherein:
the plurality of fingerprint recognition light sources are arranged in sequence along a first direction to form a row of fingerprint recognition light sources;
the plurality of fingerprint recognition light sources are arranged in sequence along a second direction to form a column of fingerprint recognition light sources;
the plurality of photosensitive sensors are arranged in sequence along the first direction to form a row of photosensitive sensors;
the plurality of the photosensitive sensors are arranged in sequence along the second direction to form a column of photosensitive sensors;
the first direction intersects the second direction;
along the first direction, an m-th fingerprint recognition light source in an n-th row overlaps an m-th fingerprint recognition light source in the (n+1)-th row in the second direction;
an m-th photosensitive sensor in an n-th row overlaps an m-th photosensitive sensor in the (n+1)-th row in the second direction; and
n and m are positive integers.

16. The display module according to claim 14, wherein:
the plurality of fingerprint recognition light sources are arranged in sequence along a first direction to form a row of fingerprint recognition light sources;
the plurality of fingerprint recognition light sources are arranged in sequence along a second direction to form a column of fingerprint recognition light sources;
the plurality of photosensitive sensors are arranged in sequence along the first direction to form a row of photosensitive sensors;
the plurality of the photosensitive sensors are arranged in sequence along the second direction to form a column of photosensitive sensors;
the first direction intersects the second direction;
along the first direction, an m-th fingerprint recognition light source in an (n+1)-th row is disposed between an m-th fingerprint recognition light source in the n-th row and an (m+1)-th fingerprint recognition light source in the n-th row;
an m-th photosensitive sensor in an (n+1)-th row is disposed between an m-th photosensitive sensor in the n-th row and an (m+1)-th photosensitive sensor in an n-th row; and
n and m are positive integers.

17. The display module according to claim 16, wherein:
along the first direction, a pattern enclosed by a connection line of geometric centers of the m-th fingerprint recognition light source in the n-th row, the (m+1)-th fingerprint recognition light source in the n-th row, the m-th fingerprint recognition light source in the (n+1)-th row, and the (m+1)-th fingerprint recognition light source in the (n+1)-th row is a first pattern;
along the first direction, a pattern enclosed by a connection line of geometric centers of the m-th photosensitive sensor in the n-th row, the (m+1)-th photosensitive sensor in the n-th row, the m-th photosensitive sensor in the (n+1)-th row and the (m+1)-th photosensitive sensor in the (n+1)-th row is a second pattern; and
the first pattern is similar to the second pattern.

18. The display module according to claim 1, wherein:
along a direction perpendicular to the plane where the display panel is located, a sum of thicknesses of layers between the surface of the cover plate on the side away from the functional layer and the imaging aperture is h01;
a sum of thicknesses of layers between a photosensitive sensor of the plurality of photosensitive sensors and an imaging aperture of the plurality of imaging apertures is h02;

a hollowed-out layer is not included between the cover plate and the photosensitive sensor; and
h01=h1 and h02=h2.

19. The display module according to claim 1, wherein:
along a direction perpendicular to the plane where the display panel is located, a sum of thicknesses of layers between the surface of the cover plate on the side away from the functional layer and the imaging aperture is h01;
a first hollowed-out layer is included between the cover plate and the photosensitive sensor;
a thickness of the first hollowed-out layer is d01, and h1=1.5d01+h01;
a sum of thicknesses of layers between the photosensitive sensor and the imaging aperture is h02;
a second hollowed-out layer is disposed between the photosensitive sensor and the imaging aperture;
a thickness of the second hollowed-out layer is d02; and h2=1.5d02+h02.

20. A display device, comprising:
a display module,
wherein the display module includes:
a fingerprint recognition layer;
a display panel; and
a cover plate,
wherein:
the display panel includes a functional layer disposed between the fingerprint recognition layer and the cover plate;
the fingerprint recognition layer includes a plurality of photosensitive sensors;
the functional layer includes a plurality of fingerprint recognition light sources and a plurality of imaging apertures;
the plurality of imaging apertures are configured to image a fingerprint that is in contact with the cover plate onto the plurality of photosensitive sensors;
a vertical distance between a surface of the cover plate at a side away from the functional layer and an imaging aperture of the plurality of imaging apertures is a first distance h1;
a vertical distance between a photosensitive sensor of the plurality of photosensitive sensors and the imaging aperture of the plurality of imaging apertures is a second distance h2;
along a direction parallel to a plane where the display panel is located, a distance between any two adjacent fingerprint recognition light sources is P1, a distance between any two adjacent photosensitive sensors is P3;

$$K = \frac{2P3 \times h1}{P1 \times h2};$$

0.8N<K<1.2N; and
N is a positive integer.

* * * * *